(12) United States Patent
Liang et al.

(10) Patent No.: US 11,515,274 B2
(45) Date of Patent: Nov. 29, 2022

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Fang-Yu Liang, Taipei (TW); Hsiu-Jen Lin, Hsinchu County (TW); Kai-Chiang Wu, Hsinchu (TW); Chih-Chiang Tsao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/885,297

(22) Filed: May 28, 2020

(65) Prior Publication Data
US 2021/0375809 A1 Dec. 2, 2021

(51) Int. Cl.
*H01L 23/00* (2006.01)
*H01L 23/538* (2006.01)
*H01L 23/498* (2006.01)

(52) U.S. Cl.
CPC ........ *H01L 24/14* (2013.01); *H01L 23/49816* (2013.01); *H01L 23/5384* (2013.01); *H01L 23/5386* (2013.01)

(58) Field of Classification Search
CPC .............. H01L 24/14; H01L 23/5384; H01L 23/5386; H01L 23/49816
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,484,291 B1 * | 11/2016 | Dhandapani | H01L 24/03 |
| 9,496,189 B2 | 11/2016 | Yu et al. | |
| 9,666,502 B2 | 5/2017 | Chen et al. | |
| 9,735,131 B2 | 8/2017 | Su et al. | |

(Continued)

*Primary Examiner* — Bac H Au
(74) *Attorney, Agent, or Firm* — JCIPRNET

(57) ABSTRACT

A semiconductor package and a manufacturing method thereof are provided. The semiconductor package includes a semiconductor die laterally covered by an insulating encapsulation, a first redistribution structure disposed on the semiconductor die and the insulating encapsulation, a second redistribution structure disposed opposite to the first redistribution structure, and a through insulating via (TIV) penetrating through the insulating encapsulation. The semiconductor die is electrically coupled to the first redistribution structure through the second redistribution structure and the TIV. The first redistribution structure includes a patterned conductive layer covered by a patterned dielectric layer, and under-ball metallurgy (UBM) pattern partially covered by the patterned dielectric layer. A first portion of the UBM pattern physically contacts a via portion of the patterned conductive layer which is tapered toward the UBM pattern, and a second portion of the UBM pattern is connected to the first portion and protruded from the patterned dielectric layer.

20 Claims, 23 Drawing Sheets

(56) References Cited

U.S. PATENT DOCUMENTS

| | | | |
|---|---|---|---|
| 10,026,668 B1* | 7/2018 | Lee | H01L 25/18 |
| 10,985,121 B2* | 4/2021 | Huang | H01L 24/11 |
| 2010/0140752 A1* | 6/2010 | Marimuthu | H01L 24/03 |
| | | | 257/621 |
| 2015/0137350 A1* | 5/2015 | Huang | H01L 24/04 |
| | | | 257/737 |
| 2017/0207197 A1* | 7/2017 | Yu | H01L 24/32 |
| 2018/0033745 A1* | 2/2018 | Cheng | H01L 21/304 |
| 2018/0096939 A1* | 4/2018 | Chiu | H01L 25/105 |
| 2018/0226378 A1* | 8/2018 | Hung | H01L 24/83 |
| 2019/0131221 A1* | 5/2019 | Lee | H01L 21/4857 |
| 2019/0131225 A1* | 5/2019 | Jeong | H01L 23/5383 |
| 2019/0157208 A1* | 5/2019 | Lin | H01L 24/20 |
| 2019/0189572 A1* | 6/2019 | Chiang | H01Q 1/2283 |
| 2020/0105676 A1* | 4/2020 | Jin | H01L 24/16 |

* cited by examiner

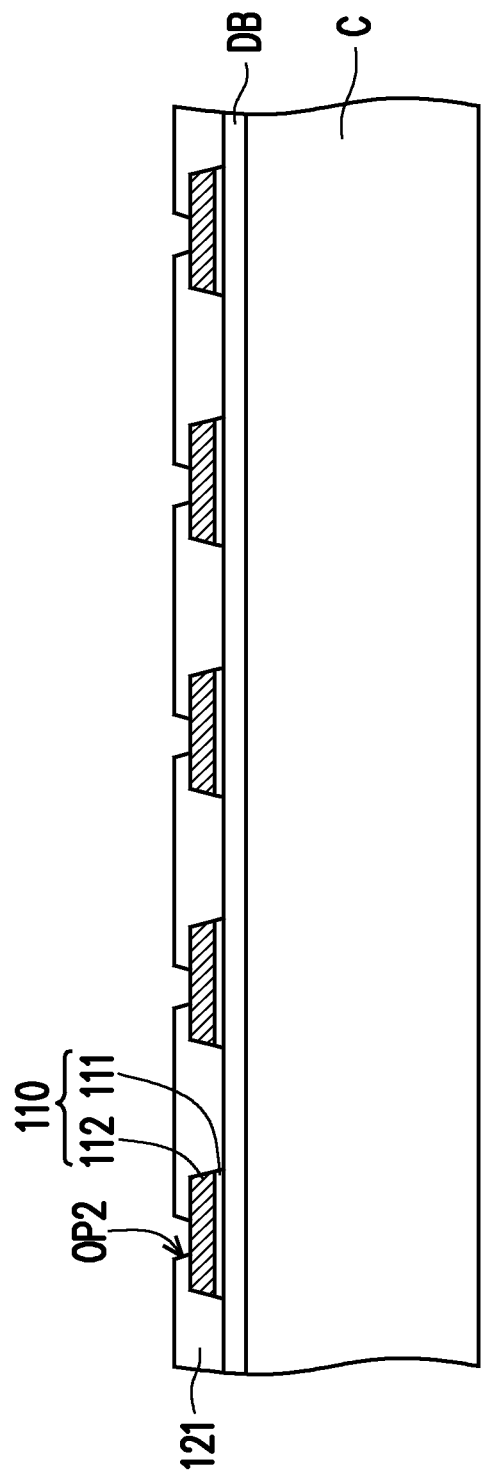

SEMICONDUCTOR PACKAGE AND MANUFACTURING METHOD THEREOF

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages. Examples of the type of device packages for semiconductors include three-dimensional integrated circuits (3DICs), wafer level packages (WLPs), and package on package (PoP) devices, etc. Some semiconductor devices are prepared by placing chips over chips on a semiconductor wafer level. The semiconductor devices provide improved integration density and other advantages, such as faster speeds and higher bandwidth, because of the decreased length of interconnects between the stacked chips. However, there are many challenges related to semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1M are schematic cross-sectional views of various stages of manufacturing a semiconductor package in accordance with some embodiments.

DETAILED DESCRIPTION

Figure 1A:
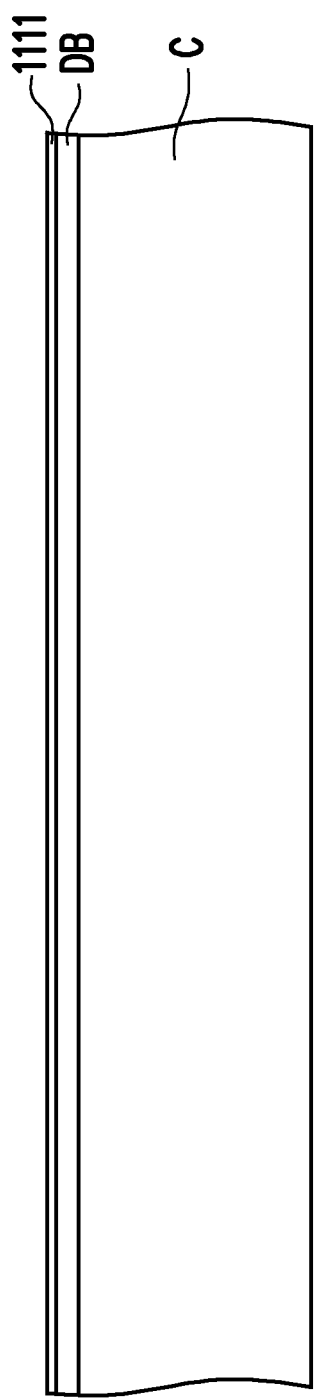

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
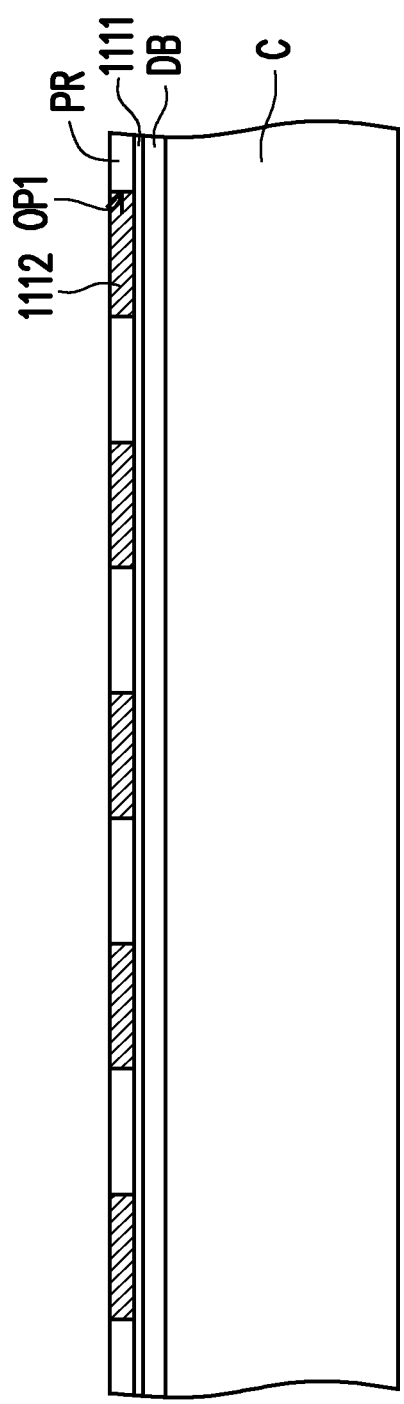
Figure 1C:
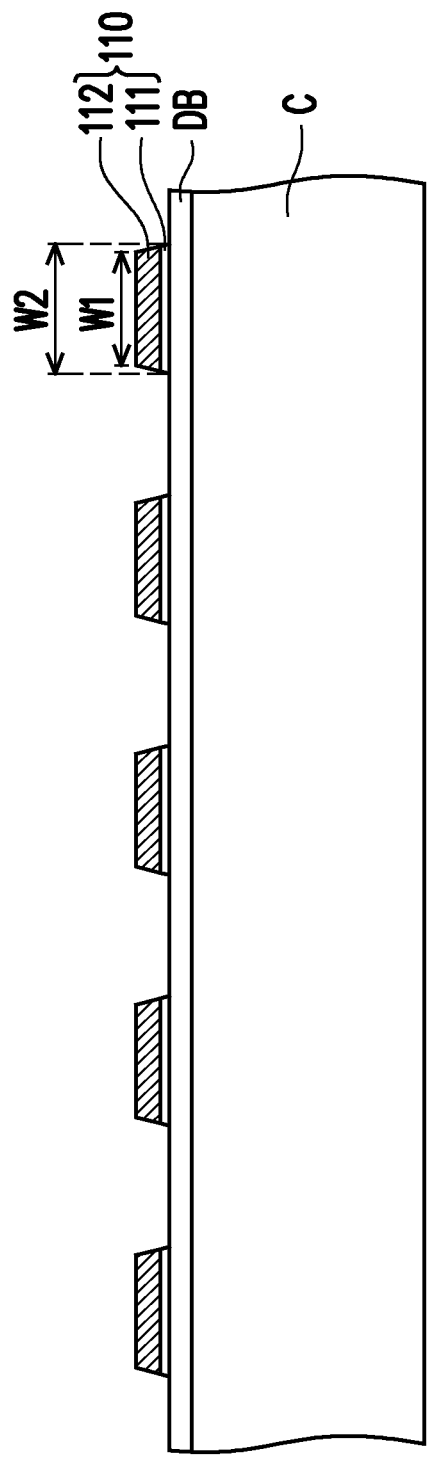
Figure 1E:
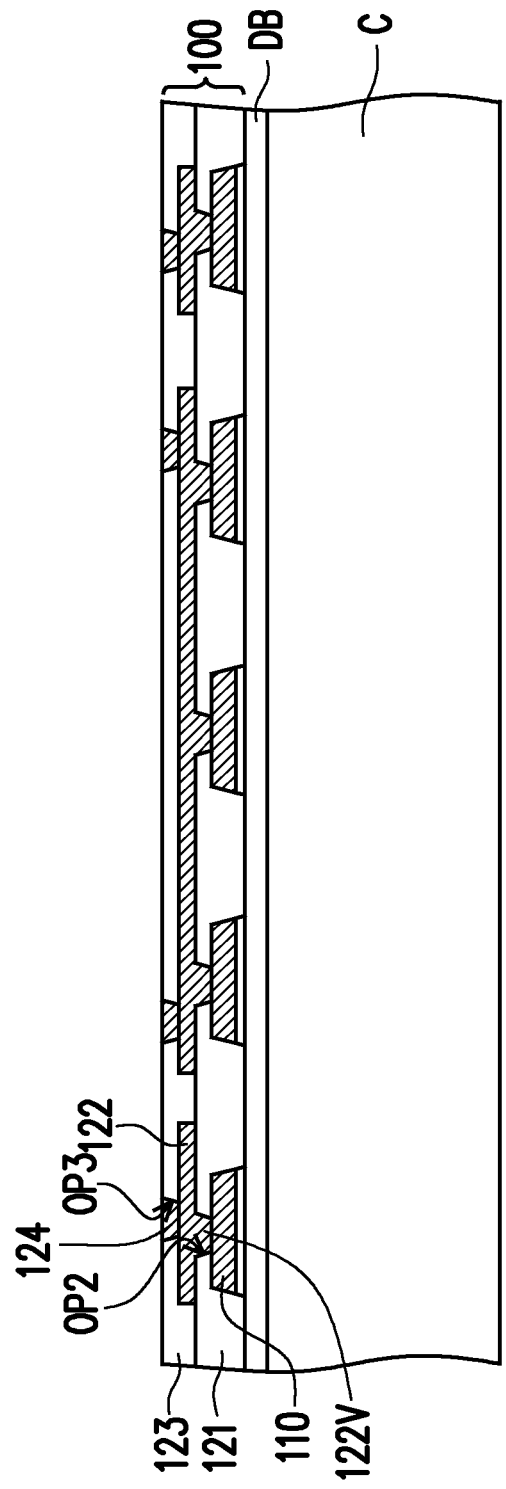
Figure 1F:
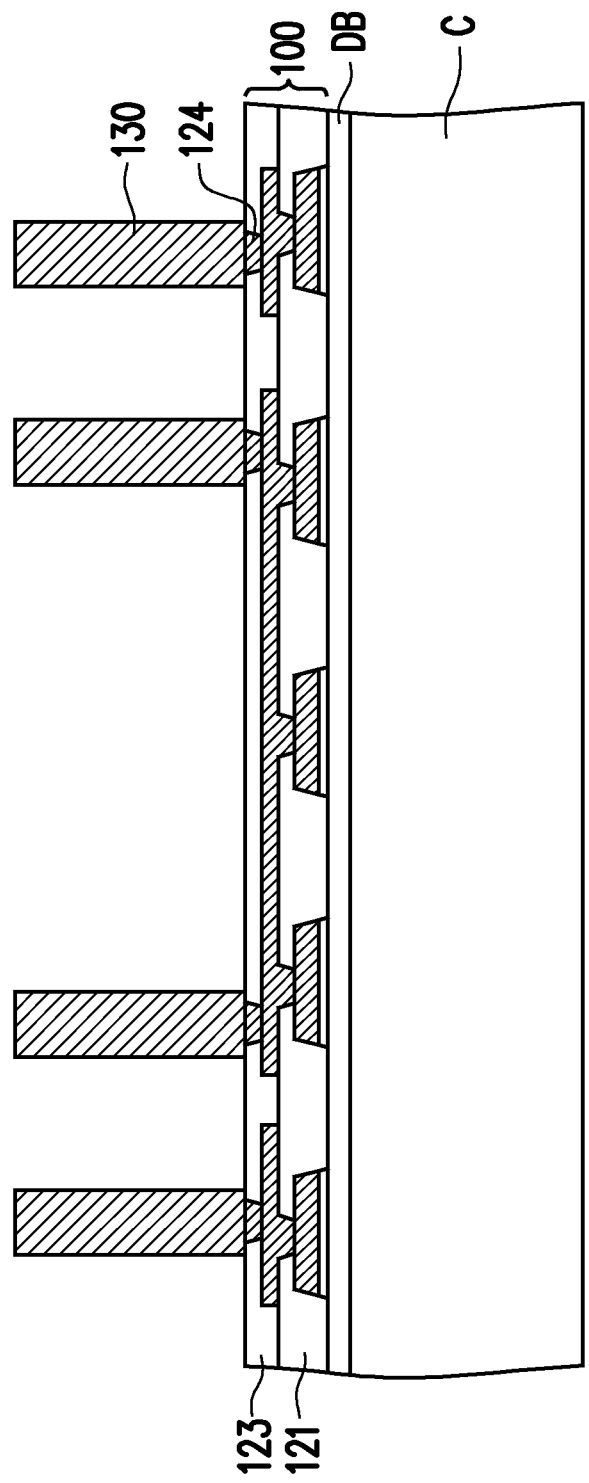
Figure 1G:
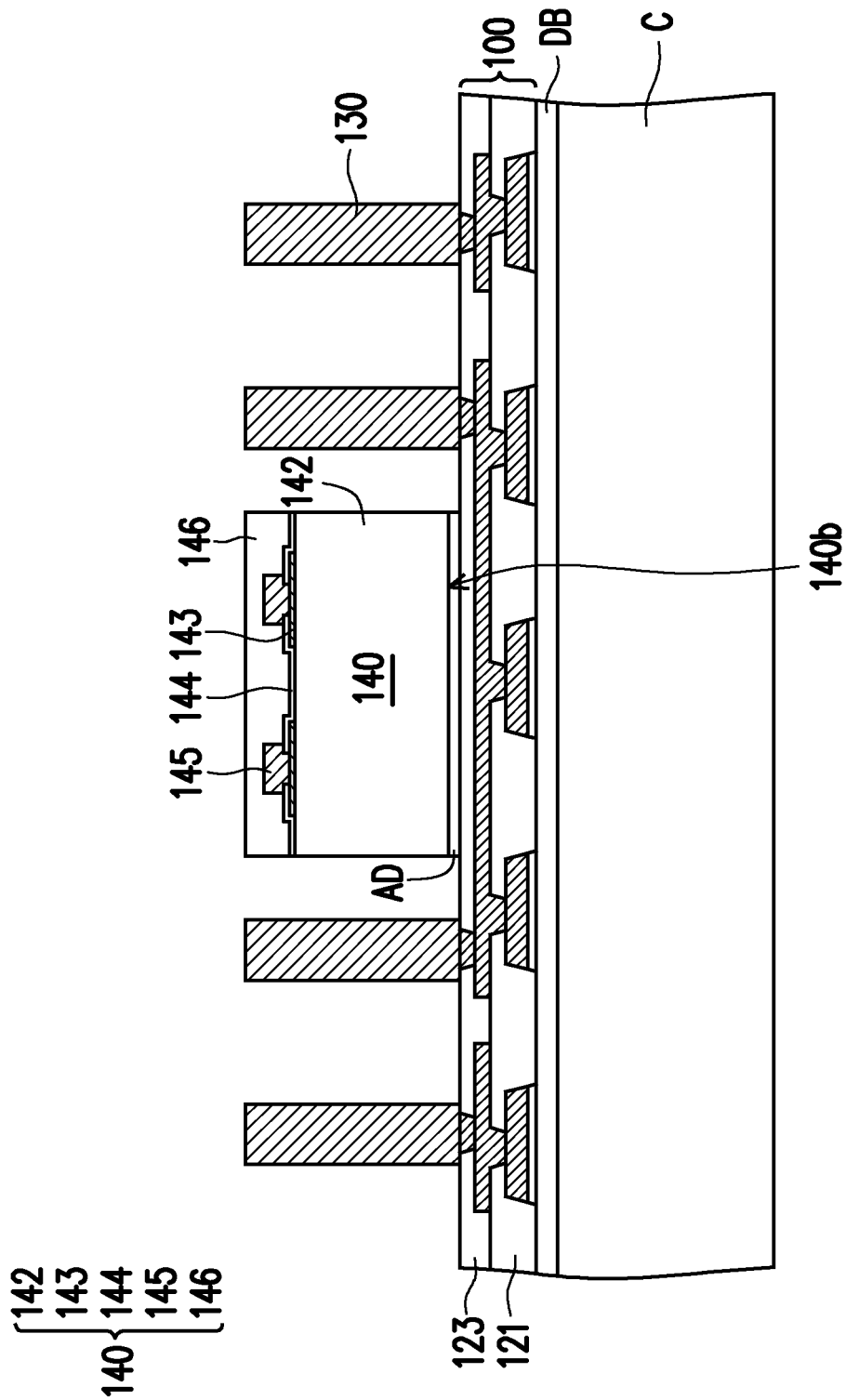
Figure 1H:
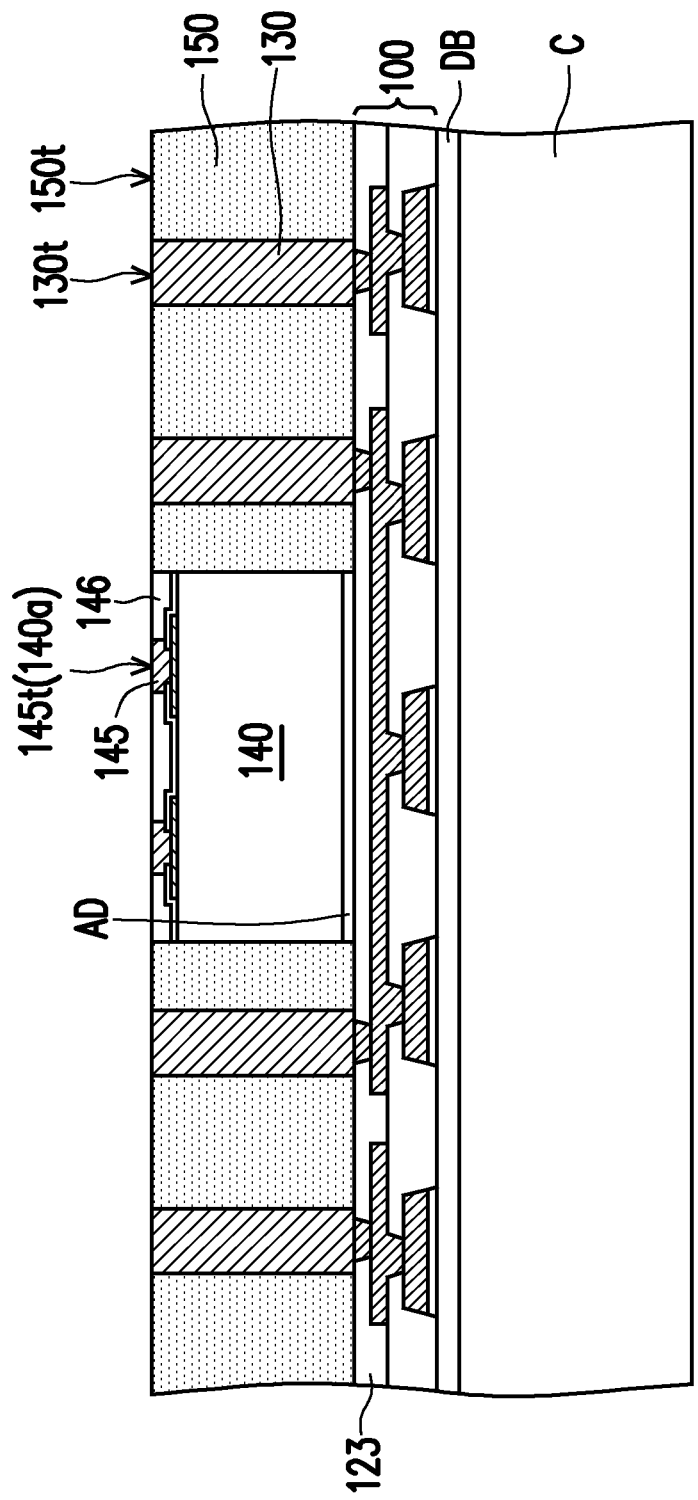
Figure 1I:
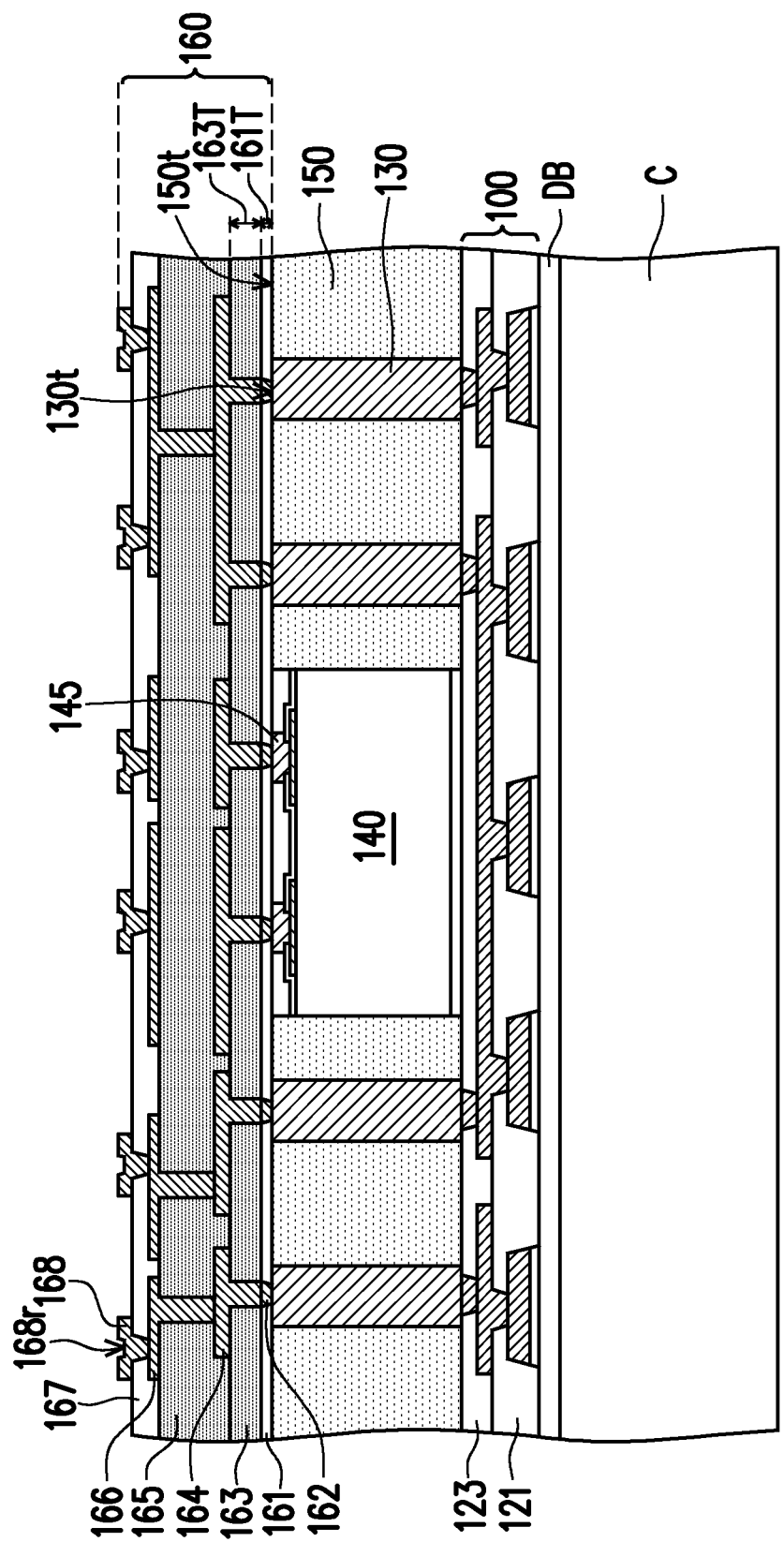
Figure 1J:
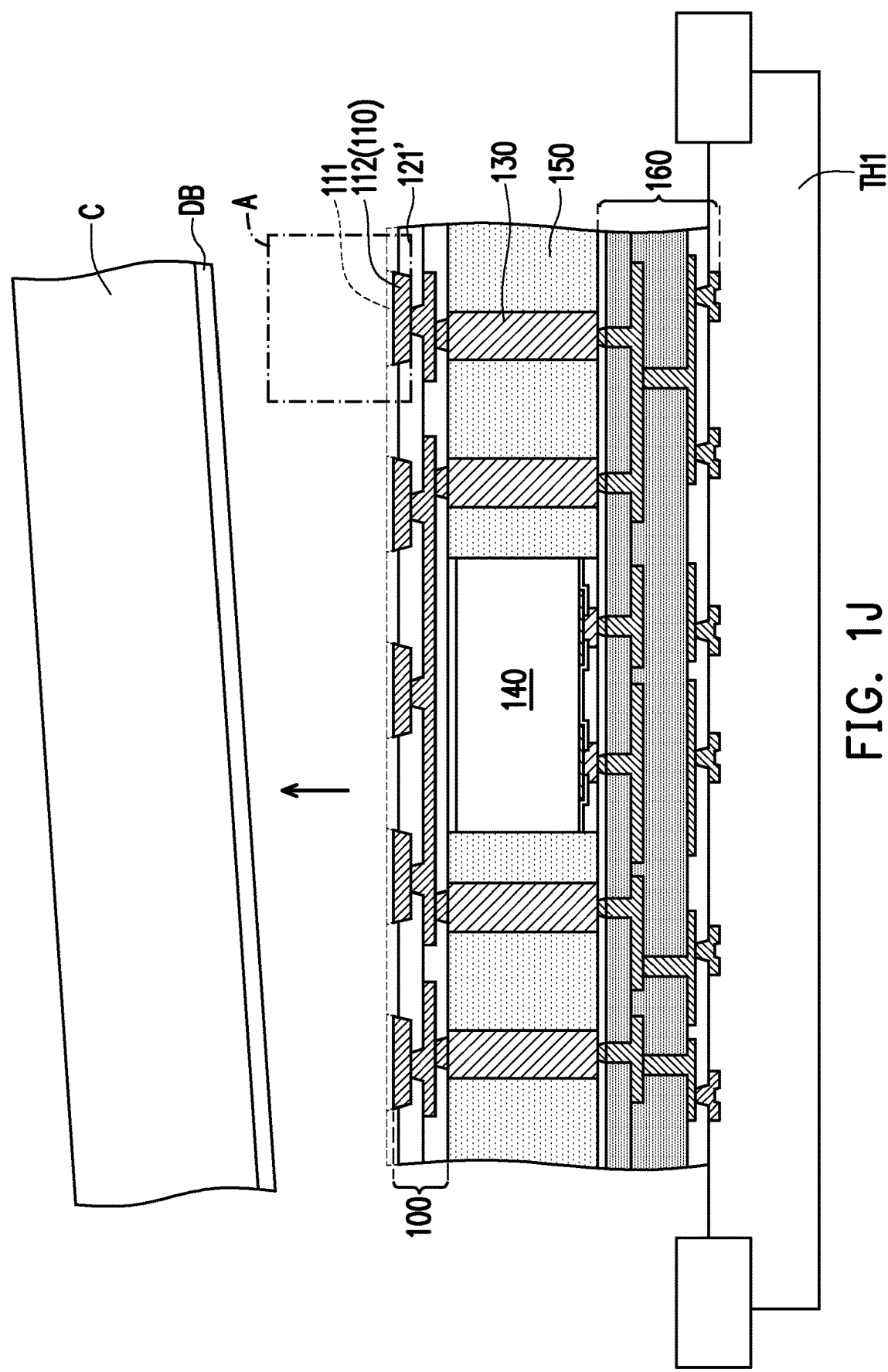
Figure 1K:
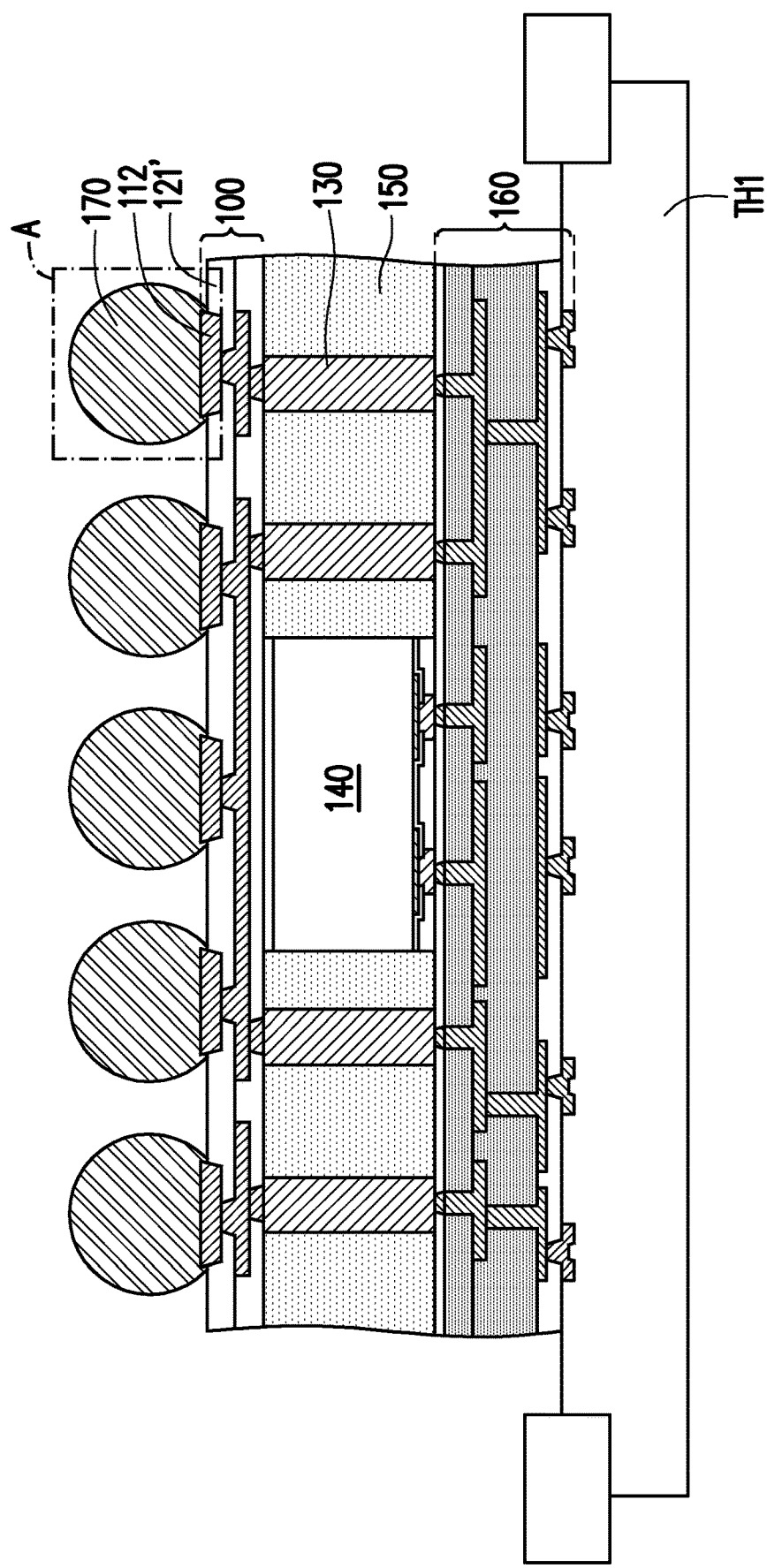
Figure 1L:
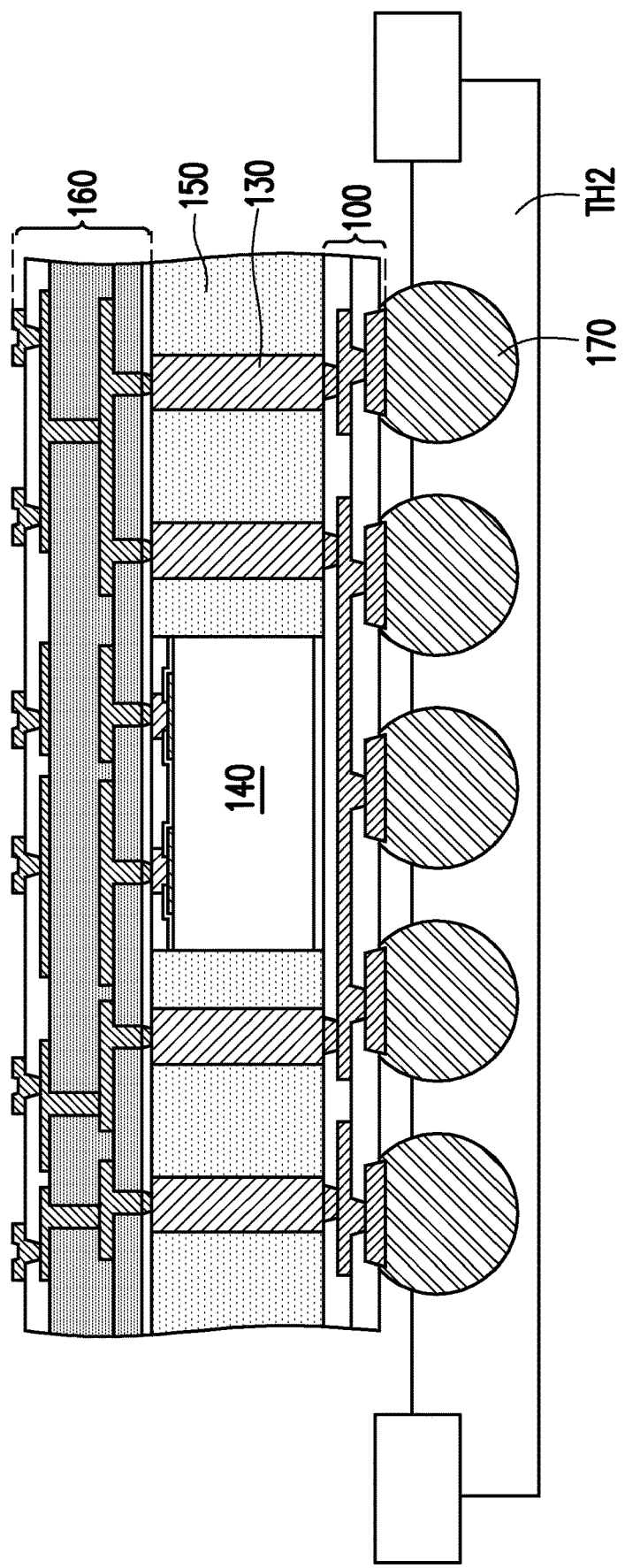
Figure 1M:
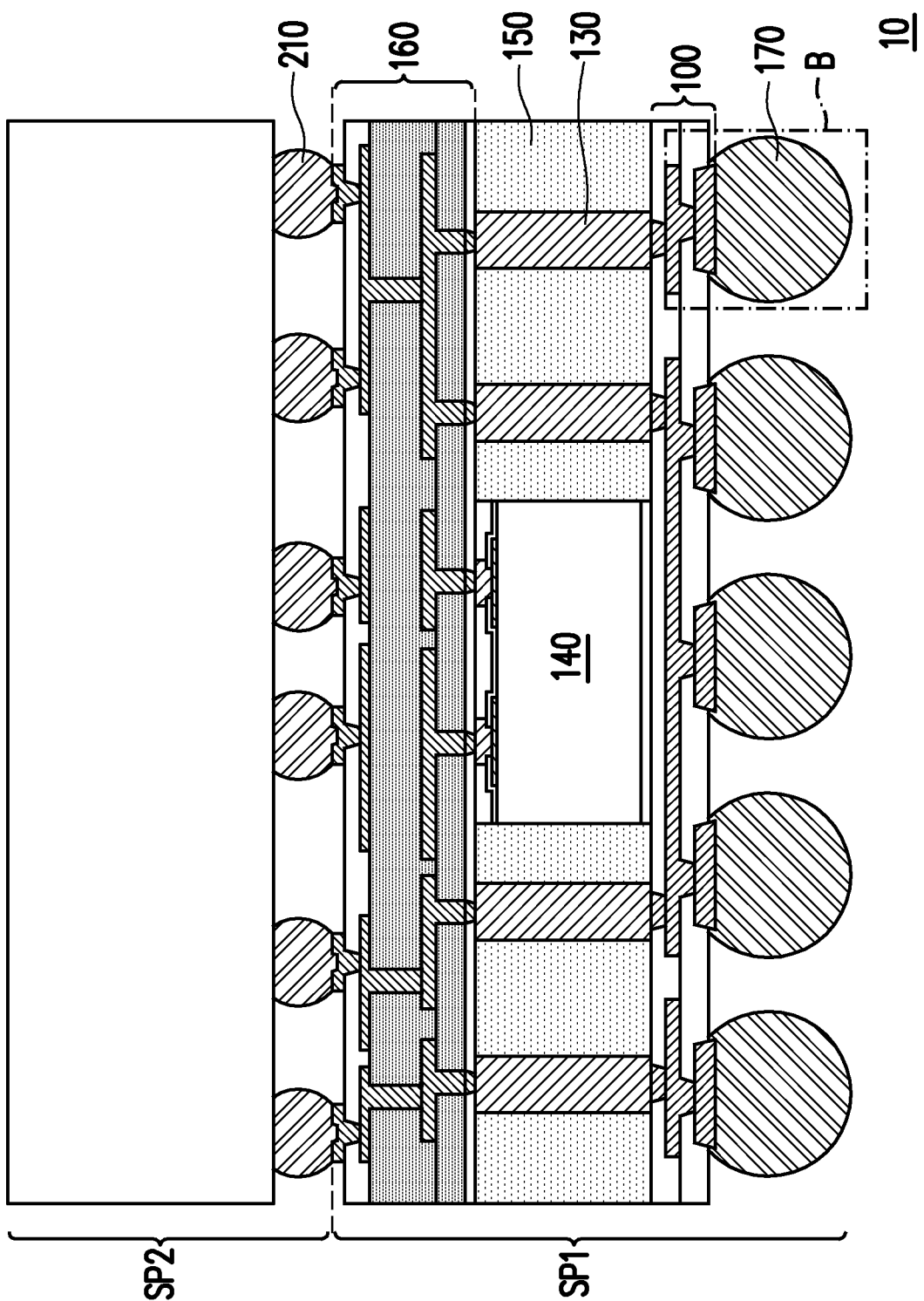
Figure 2B:
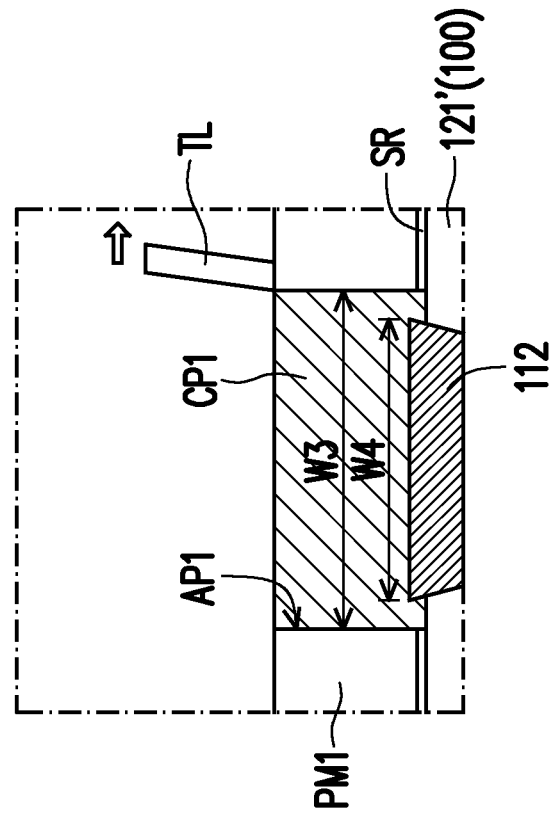
FIGS. 2A-2E are enlarged and schematic cross-sectional views illustrating the dashed region A of FIGS. 1J-1K and showing various stages in a method of forming a conductive terminal in accordance with some embodiments.
Figure 2A:
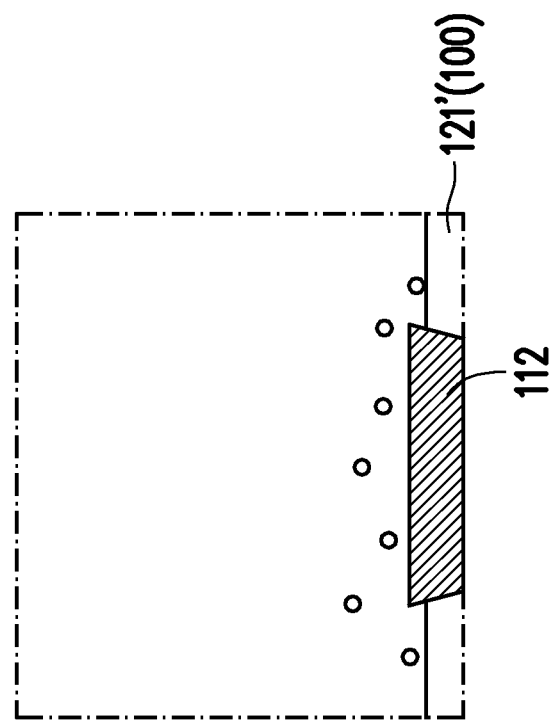
Figure 2D:
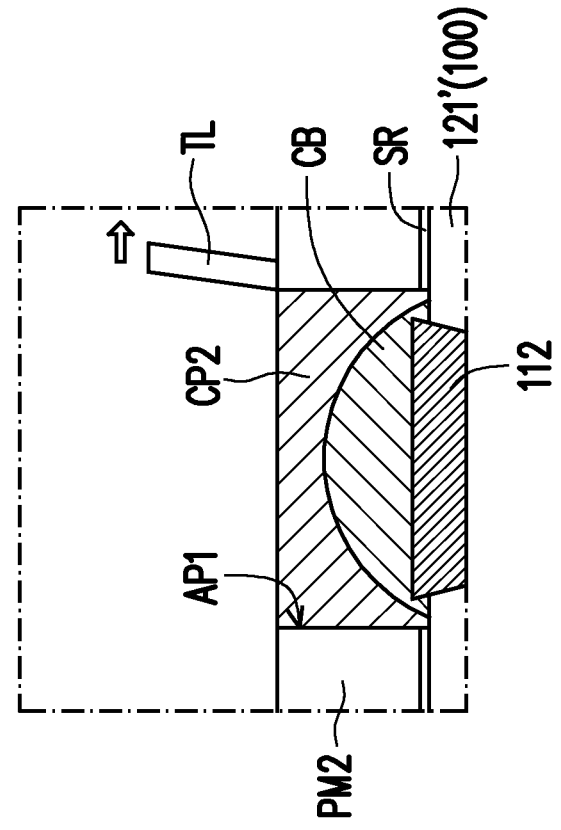
Figure 2C:
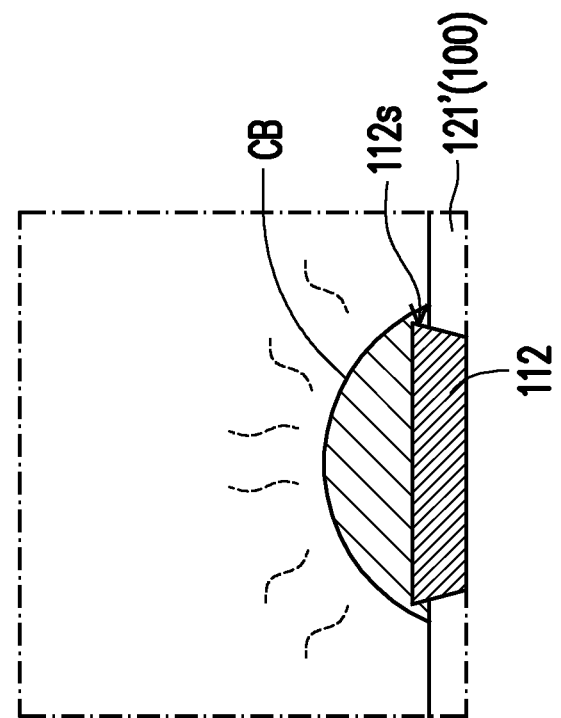
Figure 2E:
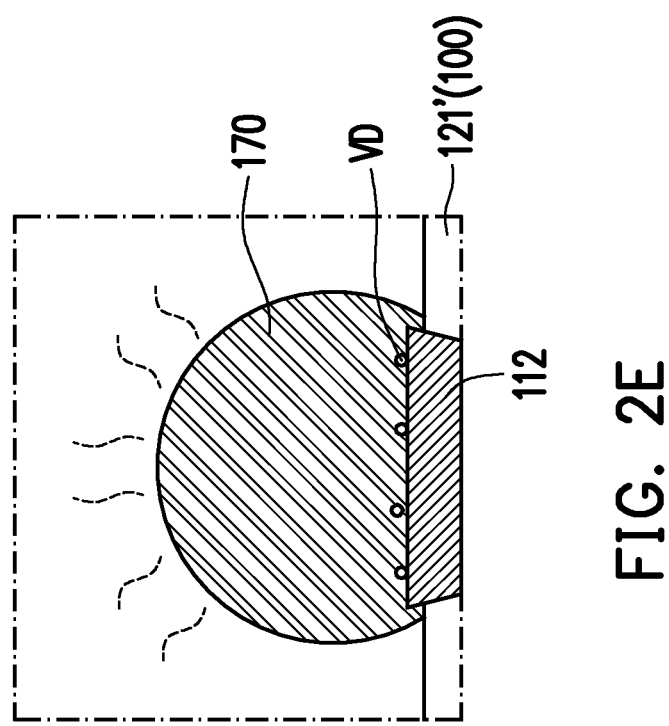
Figure 3A:
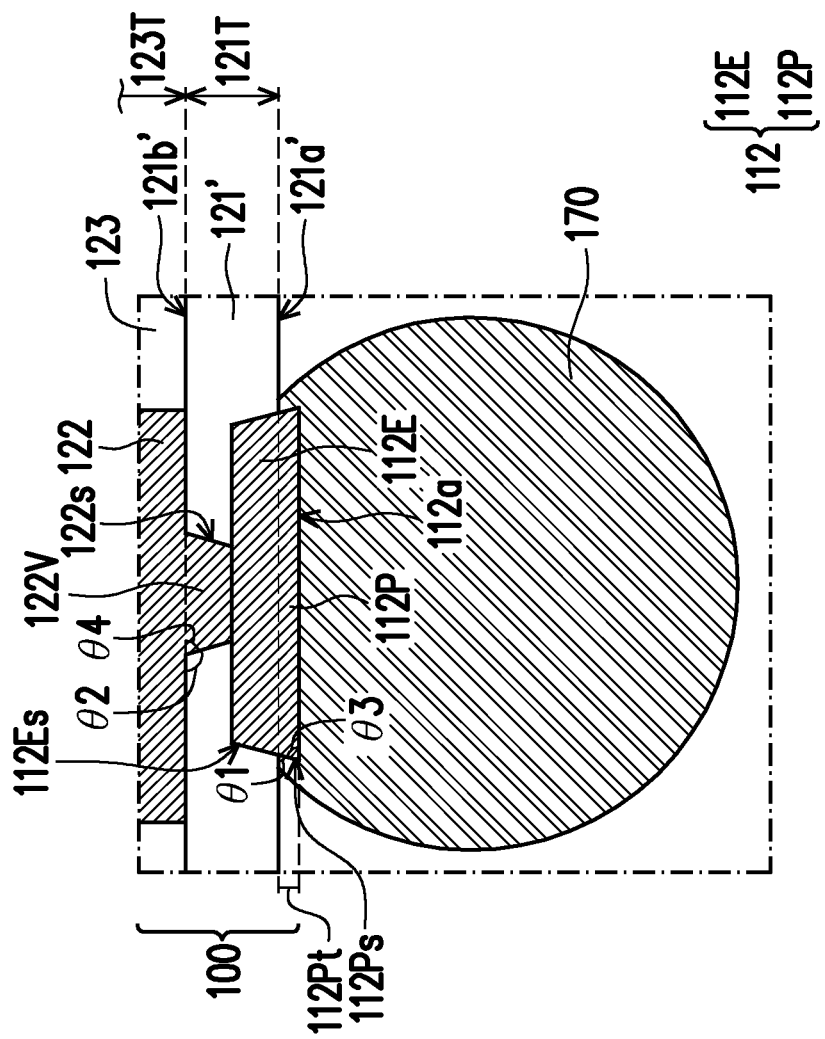
FIG. 3A is an enlarged and schematic cross-sectional view illustrating the dashed region B of FIG. 1M in accordance with some embodiments.

FIGS. 1A-1M are schematic cross-sectional views of various stages of manufacturing a semiconductor package in accordance with some embodiments, FIGS. 2A-2E are enlarged and schematic cross-sectional views illustrating the dashed region A of FIGS. 1J-1K and showing various stages in a method of forming a conductive terminal in accordance with some embodiments, and FIG. 3A is an enlarged and schematic cross-sectional view illustrating the dashed region B of FIG. 1M in accordance with some embodiments.

Referring to FIGS. 1A-1C, a conductive pattern 110 is formed over a temporary carrier C. In some embodiments, the temporary carrier C is provided with a de-bonding layer DB formed on a top surface of the temporary carrier C. For example, the de-bonding layer DB is interposed between the temporary carrier C and the conductive pattern 110. The temporary carrier C may be a glass substrate and the de-bonding layer DB may be a light-to-heat conversion (LTHC) release layer formed on the glass substrate. However, the disclosure is not limited thereto. Other suitable materials may be adapted for the temporary carrier C and the de-bonding layer DB. In some other embodiments, the de-bonding layer DB is omitted.

In some embodiments, the conductive pattern 110 is formed by the following steps. A seed material layer 1111 is formed over the top surface of the temporary carrier C. For example, the seed material layer 1111 is blanketly and conformally formed on the de-bonding layer DB disposed on the temporary carrier C. In some embodiments in which the de-bonding layer DB is not included, the seed material layer 1111 is formed directly on the temporary carrier C. In some embodiments, the seed material layer 1111 is a composite layer formed by different materials. For example, the seed material layer 1111 may be a titanium/copper (Ti/Cu) bilayer, a copper layer, or other suitable metal layer. In some embodiments, the seed material layer 1111 includes a lower layer of titanium with a layer of copper formed over it. The seed material layer 1111 may be deposited using thin-film deposition such as physical vapor deposition (PVD), e.g., sputtering, evaporation, or the like. In other embodiments, the seed material layer 1111 is formed by lamination of a foil material. Alternatively, the seed material layer 1111 may include other materials and may be formed using other suitable methods.

Continue to FIG. 1B, after the seed material layer 1111 is formed, a mask layer PR is formed on the seed material layer 1111. The mask layer PR has openings OP1 partially exposing the seed material layer 1111. For example, the mask layer PR may be or may include a photoresist or a dry film. Next, a conductive material layer 1112 (e.g., copper, copper alloys, or the like) is formed in the openings OP1 of the mask layer PR. For example, the conductive material layer 1112 is formed on the portion of the seed material layer 1111 exposed by the openings OP1 of the mask layer PR. The thickness of the conductive material layer 1112 may be thick enough to fill the openings OP1 of the mask layer PR. In some embodiments, the conductive material layer 1112 may be formed by a plating process (e.g., electro-plating, electroless-plating, immersion plating, or the like). A grinding process (e.g., mechanical grinding process, a chemical mechanical polishing (CMP) process, etc.) is optionally performed after plating. However, the disclosure is not limited thereto.

Subsequently, the mask layer PR is removed through a stripping process, an etching process, and/or a cleaning process, etc. Upon removal of the mask layer PR, a portion of the seed material layer 1111 is exposed. For example, the seed material layer 1111 not covered by the conductive material layer 1112 is exposed. Then, the exposed portion of the seed material layer 1111 may be removed through an etching process to form the seed layer pattern 111 and the conductive material pattern 112. In some embodiments, the seed layer pattern 111 and the conductive material pattern 112 are collectively referred to as the conductive pattern 110. In some embodiments, during the step of removing the exposed portion of the seed material layer 1111, the perimeter edges of the conductive material layer 1112 overlying the seed material layer 1111 may be slightly removed. In some embodiments, the cross-sectional view of the conductive pattern 110 has a trapezoidal shape, with top width W1 less than bottom width W2, as shown in FIG. 1C.

Referring to FIGS. 1D-1E, a plurality of first patterned dielectric layers (121 and 123) and a plurality of first patterned conductive layers (122 and 124) are formed over the temporary carrier C. In some embodiments, after forming the conductive pattern 110, a first patterned dielectric layer 121 is formed over the temporary carrier C to partially cover the conductive pattern 110. For example, the first patterned dielectric layer 121 includes a plurality of openings OP2 accessibly exposing at least a portion of the underlying conductive material pattern 112 of the conductive pattern 110. In some embodiments, a material of the first patterned dielectric layer 121 includes polyimide, epoxy resin, acrylic resin, BCB, PBO, or any other suitable polymer-based dielectric material. The first patterned dielectric layer 121, for example, may be formed by suitable fabrication techniques such as deposition, lithography, etching, and/or the like. In some embodiments, the cross-sectional view of each of the openings OP2 has an inverted trapezoidal shape, with top width greater than bottom width, as shown in FIG. 1D.

Continue to FIG. 1E, the first patterned conductive layer 122 is formed on the top surface of the first patterned dielectric layer 121 and a via portion 122V of the first patterned conductive layer 122 is filled into the openings OP2. For example, the via portion 122V of the first patterned conductive layer 122 is in physical and electrical contact with the conductive pattern 110. For example, the via portion 122V of the first patterned conductive layer 122 and the underlying conductive pattern 110 are tapered toward the opposite directions in the cross-sectional view. In some embodiments, the first patterned dielectric layer 123 is formed on the top surface of the first patterned dielectric layer 121 to partially cover the first patterned conductive layer 122. The first patterned dielectric layers (121 and 123) may be of the same or similar dielectric material(s) and may be formed by the same or similar step(s). The openings OP3 of the first patterned dielectric layer 123 may accessibly reveal at least a portion of the first patterned conductive layer 122 for further electrical connection.

Next, the first patterned conductive layer 124 is formed in the openings OP3 of the first patterned dielectric layer 123. The first patterned conductive layer 124 may be or may include the via portion physically and electrically connected to the first patterned conductive layer 122. In some embodiments, the first patterned conductive layer 124 includes lines and pads formed on the top surface of the first patterned dielectric layer 123 for further electrical connection. In some embodiments, the conductive pattern 110, the first patterned dielectric layers (121 and 123), and the first patterned conductive layers (122 and 124) are collectively referred to as a first redistribution structure 100. It is noted that the illustration of the first redistribution structure 100 is merely an example, and the number of the first patterned conductive layers and the number of the first patterned dielectric layers may be adjusted based on the circuit design. The disclosure is not limited thereto.

Referring to FIG. 1F, a plurality of through insulating vias (TIVs) 130 may be formed over the first redistribution structure 100. For example, the TIVs 130 are formed on the first patterned dielectric layer 123 to be in physical and electrical contact with the first patterned conductive layer 124. The material of the TIVs 130 may include copper, copper alloys, or the like. In some embodiments, the TIVs 130 are formed on the first redistribution structure 100 through a plating process. In some embodiments, the plating process includes, electro-plating, electroless-plating, immersion plating, or the like. In some embodiments, the TIVs 130 and the first patterned conductive layer 124 (i.e. the via portions) are formed during the same step. In some other embodiments, the TIVs 130 may be formed by pick and place pre-fabricated conductive pillars onto the first redistribution structure 100.

Referring to FIG. 1G, a semiconductor die 140 is disposed on the first redistribution structure 100. For example, the semiconductor die 140 is picked-and-placed onto the first patterned dielectric layer 123 of the first redistribution structure 100. In some embodiments, a back surface 140b of the semiconductor die 140 is attached to the first patterned dielectric layer 123 through an adhesive layer AD. In some embodiments, the back surface 140b of the semiconductor die 140 is attached to the adhesive layer AD when fabricating the semiconductor dies 140. The adhesive layer AD may include a die attach film (DAF), an adhesive bonding film (ABF), or other suitable adhering material. In some embodiments, the TIVs 130 surround the semiconductor die 140. In some embodiments, the TIVs 130 are formed prior to the placement of the semiconductor die 140. In some alternative embodiments, the placement of the semiconductor die 140 may precede the formation of TIVs 130.

In some embodiments, the semiconductor die 140 is manufactured through a front end of line (FEOL) process, but is not limited thereto. In some embodiments, the semiconductor die 140 includes a semiconductor substrate 142, a plurality of conductive pads 143, a passivation layer 144, a plurality of die connectors 145, and a protection layer 146. For example, the semiconductor substrate 142 may include a bulk semiconductor substrate, semiconductor-on-insulator (SOI) substrate, multi-layered semiconductor substrate, or the like. The material of the semiconductor substrate 142 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. The semiconductor substrate 142 may be doped or undoped. Semiconductor devices (not shown), such as transistors, capacitors, resistors, diodes, and the like, may be formed in and/or on the top surface (e.g., the surface facing upward) of the semiconductor substrate 142. The bottom surface of the semiconductor substrate 142 may be viewed as the back surface 140*b* of the semiconductor die 140.

The conductive pads 143 may be distributed over the top surface of the semiconductor substrate 142. In some embodiments, the conductive pads 143 may be made of aluminum or alloys thereof, or the like. The semiconductor die 140 may include an interconnection structure (not shown) disposed between the semiconductor substrate 142 and the conductive pads 143, where the conductive pads 143 physically and electrically connected to the interconnection structure. The passivation layer 144 may be formed over the top surface of the semiconductor substrate 142 to partially cover the conductive pads 143 in order to provide a degree of protection for the underlying structures. For example, the openings of the passivation layer 144 accessibly reveal at least a portion of the conductive pads 143 for further electrical connection. The passivation layer 144 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 144 may be formed through a deposition process or any suitable method.

Continue to FIG. 1G, in some embodiments, the plurality of die connectors 145 are respectively disposed on the passivation layer 144 and extend into the openings of the passivation layer 144 to be in physical and electrical contact with the conductive pads 143. For example, the die connectors 145 may include copper pillars, copper alloy pillars, or other suitable metallic pillars. In some embodiments, the die connectors 145 may include lead-based materials or lead-free materials with or without additional impurity formed on the top, but is not limited thereto. In some embodiments, the protection layer 146 is formed on the passivation layer 144 to cover the die connectors 145. For example, the protection layer 146 prevents any possible damage(s) occurring on the die connectors 145 during the transfer of the semiconductor die 140. In some embodiments, the protection layer 146 may be made of a polybenzoxazole (PBO) layer, a polyimide (PI) layer, or suitable polymers or inorganic materials. In some embodiments, the protection layer 146 may be used for providing better planarization and evenness. The numbers of the conductive pads 143 and the die connectors 145 may be selected based on demand and are not limited in the disclosure. It should be appreciated that the illustration of the semiconductor die 140 and other components throughout all figures is schematic and is not in scale.

For example, the semiconductor die 140 may include digital die, analog die or mixed signal die, such as application-specific integrated circuit (ASIC) die, logic die, sensor die, but is not limited thereto. Note that, as shown in FIG. 1G, a single semiconductor die 140 is presented for illustrative purposes; however, it should be noted that the number of the semiconductor die can be one or more than one, the disclosure is not limited thereto. In some embodiments, a plurality of semiconductor dies 140 is placed over the first redistribution structure 100 to arrange in an array. In some embodiments, additional semiconductor die(s) may be provided, and the additional semiconductor die(s) and the semiconductor die 140 may be the same type or different types.

Referring to FIG. 1H, an insulating encapsulation 150 is formed on the first redistribution structure 100 to encapsulate the TIVs 130, the semiconductor die 140, and the adhesive layer AD. For example, the insulating encapsulation 150 extends along the sidewalls of the semiconductor die 140 and the sidewalls of the TIVs 130. In some embodiments, the insulating encapsulation 150 is formed by a molding process such as compression molding, transfer molding, or the like. A planarizing process, such as chemical-mechanical polishing (CMP) or mechanical grinding may be optionally performed to remove excess insulating material.

In some embodiments, the formation of the insulating encapsulation 150 includes at least the following steps. An insulating material (not shown) is formed on the first patterned dielectric layer 123 of the first redistribution structure 100 by over-molding to encapsulate the TIVs 130, the semiconductor die 140, and the adhesive layer AD. Next, the insulating material is thinned and/or planarized until at least a portion of the TIVs 130 and at least a portion of the die connectors 145 are accessibly exposed to form the insulating encapsulation 150. A material of the insulating encapsulation 150 may be or may include a molding compound, a molding underfill, a resin (e.g., epoxy), or the like. In some embodiments, the insulating encapsulation 150 includes fillers (not shown) which are pre-mixed into insulating base material before they are applied. For example, the fillers of the insulating encapsulation 150 include particles of $Al_2O_3$, $SiO_2$, $TiO_2$, and/or the like.

In some embodiments, when reducing the thickness of the insulating material, the protection layer 146 of the semiconductor die 140 is partially removed to accessibly expose the die connectors 145. After reducing the thickness of the insulating material, at least the top surfaces 145*t* of the die connectors 145 and the top surfaces 130*t* of the TIVs 130 are revealed for further electrical connection. In some embodiments, the top surfaces 145*t* of the die connectors 145 is referred to as an active surface 140*a* of the semiconductor die 140. In some embodiments, the top surface 150*t* of the insulating encapsulation 150, the top surfaces 145*t* of the die connectors 145, and the top surfaces 130*t* of the TIVs 130 become substantially levelled with and/or coplanar to one another. In some alternative embodiments, the TIVs 130 are formed after the formation of the insulating encapsulation 150 by a drilling process (e.g., laser drilling, mechanical drilling, etc.), or other suitable process.

Referring to FIG. 1I, a second redistribution structure 160 is formed on the insulating encapsulation 150, the TIVs 130, and the semiconductor die 140. The second redistribution structure 160 may be referred to as a front side redistribution structure given its placement in the semiconductor package. The first redistribution structure 100 may be referred to as a backside redistribution structure. For example, the semiconductor die 140 is electrically coupled to the first redistribution structure 100 through the second redistribution structure 160 and the TIVs 130.

In some embodiments, the formation of the second redistribution structure 160 includes at least the following steps. A second patterned dielectric layer 161 is formed on the top surface 150t of the insulating encapsulation 150, and the openings (not labeled) of the second patterned dielectric layer 161 may accessibly reveal at least a portion of the top surfaces 130t of the TIVs 130. The second patterned dielectric layer 161 may be formed by deposition, lithography, etching, and/or other suitable methods. A material of the second patterned dielectric layer 161 may be or may include polyimide, BCB, PBO, or any other suitable dielectric material. In some embodiments, the second patterned dielectric layer 161 and the first patterned dielectric layers (121 and 123) are made of the same or similar dielectric material(s).

Next, a second patterned conductive layer 162 may be formed in the openings of the second patterned dielectric layer 161. In some embodiments, the second patterned conductive layer 162 includes conductive vias physically and electrically connected to the TIVs 130 and the die connectors 145 of the semiconductor die 140. A second intermediate dielectric layer 163 may be subsequently formed on the second patterned dielectric layer 161. In some embodiments, the second intermediate dielectric layer 163 includes openings (not labeled) exposing at least a portion of the second patterned conductive layer 162 for further electrical connection. For example, the second intermediate dielectric layer 163 may be formed by deposition, lamination, spin-coating, or any suitable technique. The openings of the second intermediate dielectric layer 163 may be formed by drilling, lithography and etching, or other suitable process. In some embodiments, the second intermediate dielectric layer 163 may be or may include a prepreg sheet, a polymer layer (e.g., Ajinomoto build-up film (ABF), a polyimide film, a resin film (e.g., a thermosetting film, a thermoplastic film), a laminate film, and/or the like. In some embodiments, a material of the second intermediate dielectric layer 163 is similar to the material of the insulating encapsulation 150.

In some embodiments, the thickness 161T is less than the thickness 163T of the second intermediate dielectric layer 163. In some embodiments, the second intermediate dielectric layer 163 is more rigid than the underlying second patterned dielectric layer 161. The second patterned dielectric layer 161 interposed between the second intermediate dielectric layer 163 and the insulating encapsulation 150 may be less rigid than the second intermediate dielectric layer 163 and the insulating encapsulation 150. For example, the Young's modulus of the second intermediate dielectric layer 163 is different from that of the second patterned dielectric layer 161. In some embodiments, the Young's modulus of the second intermediate dielectric layer 163 is greater than the Young's modulus of the second patterned dielectric layer 161. In some embodiments, the Young's modulus of the second intermediate dielectric layer 163 is similar to that of the insulating encapsulation 150. The Young's modulus of the second intermediate dielectric layer 163 may range from about 3 GPa to about 20 GPa.

Continue to FIG. 1I, a second intermediate conductive layer 164 including conductive lines and pads may be subsequently formed on the second intermediate dielectric layer 163, and a via portion of the second intermediate conductive layer 164 may fill the openings of the second intermediate dielectric layer 163 to be in physical and electrical contact with the second patterned conductive layer 162. The second intermediate conductive layer 164 may be formed by plating or other suitable deposition process. The via portion of the second patterned conductive layer 162 may be tapered from the second intermediate conductive layer 164 toward the underlying TIV 130. In some embodiments, the via portion of the second intermediate conductive layer 164 includes substantially vertical sidewalls. In some alternative embodiments, the via portion of the second intermediate conductive layer 164 is tapered toward the second patterned conductive layer 162.

In some embodiments, the second redistribution structure 160 includes a second intermediate dielectric layer 165 formed on the second intermediate dielectric layer 163, and a second intermediate conductive layer 166 formed on the second intermediate dielectric layer 165 and extending into the openings of the second intermediate dielectric layer 165. For example, the via portion of the second intermediate conductive layer 166 laterally covered by the second intermediate dielectric layer 165 may be in physical and electrical contact with the second intermediate conductive layer 164. The thickness of the second intermediate dielectric layer 165 and the thickness 163T of the second intermediate dielectric layer 163 may be substantially the same or may be different depending on the product requirements. The forming processes and the materials of the second intermediate dielectric layer 165 and the second intermediate conductive layer 166 may be similar to those of the second intermediate dielectric layer 163 and the second intermediate conductive layer 164, so the detailed descriptions are not repeated for simplicity. In some alternative embodiments, the second intermediate dielectric layer 165 and the second intermediate conductive layer 166 are omitted.

In some embodiments, the second redistribution structure 160 includes a second patterned dielectric layer 167 formed on the second intermediate dielectric layer 165, and a second patterned conductive layer 168 formed on the second patterned dielectric layer 167 and extending into the openings of the second patterned dielectric layer 167. For example, the via portion of the second patterned conductive layer 162 laterally covered by the second patterned dielectric layer 167 is in physical and electrical contact with the second intermediate conductive layer 166. The material and the forming process of the second patterned dielectric layer 167 may be the same or may be similar to those of the second patterned dielectric layer 161. For example, the second intermediate dielectric layer 165 may be more rigid than the overlying second patterned dielectric layer 167.

The second patterned conductive layer 168 may be formed on the second patterned dielectric layer 167 using patterning and metallization processes In some other embodiments, the second patterned dielectric layer 167 includes a plurality of pads (not labeled) for electrically connecting with the later-formed components. For example, the above-mentioned pads include under-ball metallurgy (UBM) patterns for ball mount and/or connection pads for mounting of electronic components. In some embodiments, the respective pad of the second patterned conductive layer 168 includes a recess 168r corresponding to the via portion of the second patterned conductive layer 168. In some other embodiments, the pads of the second patterned conductive layer 168 include flat top surfaces. It is noted that the shape and number of the pads are not limited in this disclosure.

In some embodiments in which the second intermediate dielectric layer 165 and the second intermediate conductive layer 166 are omitted, the second patterned dielectric layer 167 may be formed on the second intermediate dielectric layer 163, and the second patterned conductive layer 168 may be formed on the second patterned dielectric layer 167 to be in direct contact with the second intermediate conductive layer 164. In some embodiments in which the second intermediate dielectric layers (163 and 165) and the second intermediate conductive layers (164 and 166) are omitted, the second patterned dielectric layer 167 may be formed on the second patterned dielectric layer 161, and the second patterned conductive layer 168 may be formed on the second patterned dielectric layer 167 to be in direct contact with the second patterned conductive layer 162. It should be understood that the illustration of the second redistribution structure 160 in the FIG. 1I is merely an example, and the numbers of the second patterned dielectric layers, the second patterned conductive layer, the second intermediate dielectric layers, and the second intermediate conductive layers may be adjusted depending on the circuit requirements.

Referring to FIG. 1J and also with reference to FIG. 1I, the structure in FIG. 1I may be flipped (turned upside down) and then placed on a tape holder TH1 for subsequent processes. For example, after being mounted, the second redistribution structure 160 is adhered to the tape holder TH1. The temporary carrier C and the de-bonding layer DB may be removed to expose the first redistribution structure 100. For example, the temporary carrier C is detached from the first redistribution structure 100 through a de-bonding process. In some embodiments, the de-bonding layer DB (e.g., the LTHC release layer) is irradiated by an UV laser such that the first redistribution structure 100 may be peeled off from the temporary carrier C. Other suitable removal methods (grinding, etching, etc.) may be used to release the temporary carrier C. In some embodiments, the structure is placed on the tape holder TH1 prior to removing the temporary carrier C. In some other embodiments, the de-bonding of the temporary carrier C may be performed prior to placing on the tape holder TH1.

Continue to FIG. 1J, in some embodiments, during the process of removing the de-bonding layer DB, a portion of the first patterned dielectric layer 121 is removed. For example, the first patterned dielectric layer 121 is slightly etched to form the etched dielectric layer 121'. In some embodiments, the conductive pattern 110 protruded from the etched dielectric layer 121' is viewed as the under-ball metallurgy (UBM) pattern of the first redistribution structure 100. In some embodiments, after removing the de-bonding layer DB, a removal process (e.g., a plasma etch (PLDC) or the like) is performed to remove the seed layer pattern 111. Under this scenario, the UBM pattern is the remaining part of the conductive pattern 110 (e.g., conductive material pattern 112). It is noted that the seed layer pattern 111 and the portion of the first patterned dielectric layer 121 are shown in phantom to indicate those parts may be removed during processing. In alternative embodiments, the seed layer pattern 111 is remained after removing the de-bonding layer DB and the temporary carrier C. Under this scenario, the UBM pattern includes the seed layer pattern 111 overlying the conductive material pattern 112.

Referring to FIG. 1K and also with reference to FIGS. 2A-2E, a plurality of conductive terminals 170 may be formed on the UBM pattern of the first redistribution structure 100. For example, the semiconductor die 140 is electrically coupled to the conductive terminals 170 through the second redistribution structure 160, the TIVs 130, and the first redistribution structure 100. In some embodiments, the conductive terminals 170 are made of a conductive material with low resistivity, such as Sn, Ag, Cu, Pb, Ni, Ge, Bi and the arbitrary combination thereof. The conductive terminals 170 may be ball grid array (BGA) connectors, solder balls, metal pillars, or the like. In some embodiments, the conductive terminals 170 are formed by initially forming a layer of solder through methods such as ball drop, evaporation, electroplating, printing, dispensing, or the like.

For example, the forming process of the conductive terminals 170 includes at least the following steps. As shown in FIG. 2A, a pre-treatment process (e.g., wet clean process) may be performed to the conductive material pattern 112. For example, native oxide on the top surface of the conductive material pattern 112 may be removed during the pre-treatment process. Next, a first patterned mask PM1 including a plurality of first apertures AP1 is overlaid on the first redistribution structure 100. The first patterned mask PM1 may be a stencil (e.g., metal sheet) having the first apertures AP1 corresponding to the UBM pattern (e.g., conductive material pattern 112).

In some embodiments, the maximum width W3 of the respective first aperture AP1 may be greater than the top width W4 of the UBM pattern (e.g., conductive material pattern 112). For example, the maximum width W3 of the respective first aperture AP1 is about 330 µm and the top width W4 of the UBM pattern is about 200 µm. In some alternative embodiments, the maximum width W3 is substantially equal to the top width W4. It is noted that the values of the widths (e.g., W3 and W4) may be adjusted depending on the product requirements. In some embodiments, the first patterned mask PM1 is provided with a seal ring SR, and when disposing the first patterned mask PM1 on the first redistribution structure 100, the seal ring SR is interposed between the first patterned mask PM1 and the etched dielectric layer 121'. The seal ring SR may seal the gap between the first patterned mask PM1 and the etched dielectric layer 121'. The seal ring SR may effectively confine the material formed in the first apertures AP1 and prevent bridging between the conductive material pattern 112.

Continue to FIG. 2B, after the first patterned mask PM1 is disposed on the etched dielectric layer 121' of the first redistribution structure 100, a conductive paste CP1 is formed in the first aperture AP1 of the first patterned mask PM1. For example, one or more tools (e.g., squeegee, blade, or wiper) TL may brush across the first patterned mask PM1 back and forth to apply the conductive paste CP1 in the first aperture AP1. In some embodiments, the conductive paste CP1 is solder paste. For example, the solder paste may be or may include solder particles in a flux medium material. Other suitable conductive paste may also be used. In some embodiments, the conductive paste CP1 is formed in a liquid form or a semi-liquid form that has a high viscosity. A higher viscosity conductive paste CP1 may spread less and reduce residue staining. In some embodiments, the viscosity of the conductive paste CP1 is about 1200 Pa·s. For example, the viscosity of the conductive paste CP1 is about 1000 Pa·s to about 1500 Pa·s.

Continue to FIG. 2C, the first patterned mask PM1 is removed and a first reflow process is performed to form a conductive bump CB. For example, during the first reflow process, the conductive paste CP1 is transformed into a bump shape. In some embodiments, during melting, the conductive bump CB is not limited by the UBM pattern (e.g., conductive material pattern 112). For example, a sidewall 112s of the conductive material pattern 112 protruded from the etched dielectric layer 121' is covered by the conductive bump CB. In some embodiments, a bottom portion of the conductive bump CB is in physical contact with the top surface of the etched dielectric layer 121'. In the first reflow process, the temperature of the conductive paste CP1 is raised to between about 230° C. and about 240° C. The first reflow process may partially liquefy the conductive paste CP1, which then pulls itself into the bump shape due to the surface tension of the conductive paste CP1.

Continue to FIG. 2D, in some embodiments, after the first reflow process, a second patterned mask PM2 including a plurality of second apertures AP2 is disposed over the first redistribution structure 100. The second apertures AP2 may expose the conductive bump CB. In some embodiments, the second patterned mask PM2 is provided with the seal ring SR, and after disposing the second patterned mask PM2, the seal ring SR is interposed between the second patterned mask PM2 and the etched dielectric layer 121'. The second patterned mask PM2 may be similar to the first patterned mask PM1. Manufacturing defects (e.g., bridging and/or cold-joints) may be reduced by configuring the patterned masks (e.g., PM1 and PM2) with the seal ring SR to effectively confine the conductive pastes in the apertures of the patterned masks. After placing the second patterned mask PM2 on the etched dielectric layer 121', a conductive paste CP2 is formed in the second apertures AP2 of the second patterned mask PM2 and covers the conductive bump CB. For example, the tool TL may brush across the second patterned mask PM2 to apply the conductive paste CP2 in the second aperture AP2. The conductive paste CP2 may be or may include the same or similar material to the conductive paste CP1.

Continue to FIG. 2E, after forming the conductive paste CP2 in the second patterned mask PM2, the second patterned mask PM2 may be removed, and a second reflow process may be performed to soften and reshape the conductive paste CP2 such that the conductive terminal 170 is formed. The printing and reflowing steps may be repeated to obtain the conductive terminal 170 with a desired height. The conductive terminal 170 having a greater bump diameter is desired in order to achieve better reliability. In some other embodiments, the one-step printing and reflowing process may be performed to form the conductive terminal 170. For example, the steps described in FIGS. 2D-2E may be omitted.

Still referring to FIG. 2E, voids VD may be found in the conductive terminal 170. In some embodiments, the void VD may be located in proximity to the interface between the conductive material pattern 112 and the conductive paste CP1. For example, the voids VD are generated in the bottom of the conductive terminal 170 and may be located above the top surface of the conductive material pattern 112. The cause of formation of the void VD may be a gas (or air) being trapped in an area between the conductive material pattern 112 and the conductive paste CP1. In some embodiments, the respective void VD is surrounded by the resin material of the conductive paste CP1. In some embodiments, in a top view, the area occupied by the voids VD is less than 10% of the area of the top surface of the corresponding UBM pattern (e.g., conductive material pattern 112). In some alternative embodiments, the conductive terminal 170 is free of the void VD.

It is understood that forming the insulating encapsulation 150 by molding may result in warpage of the resulting structure. Since the base of the UBM pattern (e.g., conductive material pattern 112) is formed prior to the molding process, negative effects on forming the conductive terminals 170 causing by warpage may be advantageously reduced. The manufacturing process described above may be viewed as the UBM pattern first process. The UBM pattern first process may provide better warpage control. Since the first patterned conductive layer 122 is directly formed on the base of the UBM pattern (e.g., conductive material pattern 112) after formation of the conductive material pattern 112, the UBM pattern first process may enhance routability and improve electrical performance. Since the conventional process of forming openings on the first patterned dielectric layer to expose the first patterned conductive layer so as to form the UBM pattern on the first patterned conductive layer involves involve many complicated steps and operations, the UBM pattern first process may provide benefits by increasing production efficiency and lowering associated costs.

Referring to FIG. 1L, after forming the conductive terminals 170, the structure shown in FIG. 1K is de-bonded from the tape holder TH1. Next, the structure may be flipped (turned upside down) and then placed on a tape holder TH2. For example, the conductive terminals 170 are disposed on the tape holder TH2 and the second redistribution structure 160 faces upwards for further electrical connection.

Referring to FIG. 1M, a semiconductor package 10 including a second package component SP2 stacked on a first package component SP1 is provided. For example, the second package component SP2 is disposed on the second redistribution structure 160. In some embodiments, a plurality of external terminals 210 is physically and electrically connected to the second patterned conductive layer 168 of the second redistribution structure 160. For example, a reflow process is performed on the external terminals 210 to enhance the adhesion between the external terminals 210 and the pads of the second patterned conductive layer 168.

The second package component SP2 may include various other components, layers, circuits, and structures that have been omitted herein for the sake of brevity. For example, the second package component SP2 may include one or more semiconductor dies (not shown) encapsulated by molding compound or another suitable encapsulant. A redistribution layer (not shown) of the second package component SP2 may be electrically connected to the semiconductor dies and the external terminals 210. In some embodiment, the semiconductor dies of the second package component SP2 are electrically coupled to the first package component SP1 through the external terminals 210. In some embodiments, an underfill layer (not shown) is optionally formed between the gap of the second package component SP2 and the first package component SP1. In some embodiments, the size of the respective conductive terminal 170 is greater than the size of the respective external terminal 210. For example, the spacing between adjacent two of the external terminals 210 is less than the spacing between adjacent two of the conductive terminals 170. Although the dimension of the external terminal 210 construe no limitation in the disclosure.

In some embodiments, after coupling the second package component SP2 to the second redistribution structure 160, a singulation process may be performed to cut through the second redistribution structure 160, the insulating encapsulation 150, and the first redistribution structure 100. After the singulation process, the first package component SP1 is formed. In some embodiments, the singulation process may be performed while the tape holder TH2 carries the structure in place. In some alternative embodiments, the singulation process is performed prior to coupling the second package component SP2.

Continue to FIG. 1M and also with reference to FIG. 3A, recall that the first patterned dielectric layer 121 is slightly etched during the removing process of the temporary carrier C and the de-bonding layer DB, the thickness 121T of the etched dielectric layer 121' may be less than the thickness 123T of the overlying first patterned dielectric layer 123. In addition, since the first patterned dielectric layer 121 is thinned to form the etched dielectric layer 121', the UBM pattern (e.g., conductive material pattern 112) is laterally and partially covered by the etched dielectric layer 121'. For example, the UBM pattern (e.g., conductive material pattern 112) may have an embedded portion 112E laterally covered by the etched dielectric layer 121' and a protruded portion 112P exposed by the etched dielectric layer 121'. The UBM pattern (e.g., conductive material pattern 112) may not extend to the bottom surface 121a' of the etched dielectric layer 121'. For example, the UBM pattern (e.g., conductive material pattern 112) is not in physical contact with the bottom surface 121a' of the etched dielectric layer 121'.

In some embodiments, the protruded portion 112P is protruded from the bottom surface 121a' of the etched dielectric layer 121'. In some embodiments, a thickness 112Pt of the protruded portion 112P ranges from about 1 µm to about 3 µm. For example, the thickness 112Pt of the protruded portion 112P is about 2 µm. In some embodiments, the etched dielectric layer 121' covering the embedded portion 112E of the UBM pattern and the via portion 122V of the first patterned conductive layer 122 has the thickness 121T. A ratio of the thickness 112Pt and the thickness 121T may be adjusted depending on process variations and product requirements.

In some embodiments, the UBM pattern (e.g., conductive material pattern 112) having the embedded portion 112E and the protruded portion 112P is tapered toward the first patterned conductive layer 122. Since the embedded portion 112E and the protruded portion 112P are the conductive material pattern 112, the sidewall 112Es of the embedded portion 112E is coterminous with the sidewall 112Ps of the protruded portion 112P. In some embodiments, an angle θ1 between the sidewall 112Ps of the protruded portion 112P and the bottom surface 121a' of the etched dielectric layer 121' is less than 90°. For example, the angle θ1 ranges from about 90° to about 100°. In alternative embodiments, the angle θ1 is approximately 90°.

In some embodiments, the via portion 122V of the first patterned conductive layer 122 covered by the etched dielectric layer 121' is tapered toward the UBM pattern (e.g., conductive material pattern 112). For example, the via portion 122V of the first patterned conductive layer 122 and the UBM pattern (e.g., conductive material pattern 112) are tapered toward the opposing directions (e.g., downwardly and upwardly). In some embodiments, in the cross-sectional view shown in FIG. 3A, the UBM pattern (e.g., conductive material pattern 112) is of a trapezoidal shape and the via portion 122V of the first patterned conductive layer 122 is of an inverted trapezoidal shape. For example, in the cross-sectional view, the profile of the UBM pattern (e.g., conductive material pattern 112) is an acute trapezoid has two adjacent acute angles on its longer base edge. In some embodiments, in the cross-sectional view, the profile of the UBM pattern (e.g., conductive material pattern 112) is an isosceles trapezoid, where the base angles have the same measure. Although the UBM pattern may have other cross-sectional profile(s) depending on process recipe and product requirements.

In some embodiments, the sidewall 122s of the via portion 122V of the first patterned conductive layer 122 covered by the etched dielectric layer 121' may be sloped. For example, an angle θ2 between the sidewall 122s of the via portion 122V of the first patterned conductive layer 122 and the top surface 121b' of the etched dielectric layer 121' is less than 90°. In some embodiments, the angle θ1 is greater than the angle θ2. For example, the angle θ2 ranges from about 75° to about 90°. In some embodiments, in the cross-sectional view, the profile of the via portion 122V is an acute inverted trapezoid has two adjacent acute angles on its longer base edge. In some embodiments, in the cross-sectional view, the profile of the via portion 122V is an isosceles inverted trapezoid. In some embodiments, an acute angle θ3 of the trapezoidal cross section of the UBM pattern (e.g., conductive material pattern 112) is greater than an acute angle θ4 of the inverted trapezoidal cross section of the via portion 122V of the first patterned conductive layer 122.

Figure 3B:
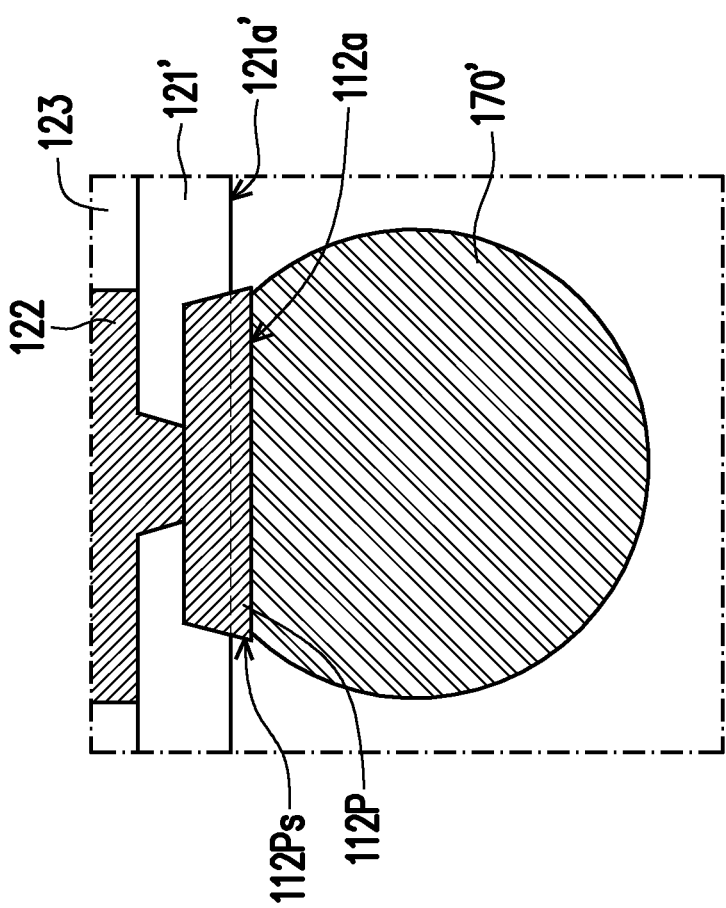
FIG. 3B is an enlarged and schematic cross-sectional view illustrating the dashed region B of FIG. 1M in accordance with some other embodiments.

In some embodiments, the bottom surface 112a of the protruded portion 112P of the UBM pattern (e.g., conductive material pattern 112) is covered by the conductive terminal 170. The bottom surface 112a may be viewed as an interface between the UBM pattern and the conductive terminal 170. In some embodiments, since the seed layer pattern 111 is removed before forming the conductive terminal 170, the interface between the UBM pattern and the conductive terminal 170 is free of titanium layer. In some embodiments, the conductive terminal 170 further extends to cover the sidewall 112Ps of the protruded portion 112P of the UBM pattern (e.g., conductive material pattern 112) and the conductive terminal 170 may be in physical contact with the bottom surface 121a' of the etched dielectric layer 121'. In some other embodiments, the sidewall 112Ps of the protruded portion 112P of the UBM pattern (e.g., conductive material pattern 112) is not covered by the conductive terminal 170' as shown in FIG. 3B. For example, the conductive terminal 170' lands on the protruded portion 112P of the UBM pattern (e.g., conductive material pattern 112) without extending to cover the sidewall 112Ps of the protruded portion 112P and the bottom surface 121a' of the etched dielectric layer 121'.

In some embodiments, the semiconductor package 10 is referred to as a package-on-package (PoP) device. For example, the PoP device may combine vertically discrete memory and logic package components. In some embodiments, the PoP device is referred to an integrated fan-out (InFO) PoP device since the contact positions of the original die are fanned out to a larger foot print. In some embodiments, the semiconductor package 10 may be electrically coupled to another electrical component, e.g., a printed circuit board (PCB), a printed wiring board, interposer, package substrate, and/or other carrier that is capable of carrying integrated circuits. For example, the conductive terminals 170 of the first package component SP1 is mounted on the another electrical component. The semiconductor package 10 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

FIGS. 4A-4E are schematic cross-sectional views of various stages of manufacturing a semiconductor package in accordance with some embodiments. The manufacturing method of the semiconductor package is similar to that of the semiconductor package 10 described in FIGS. 1A-1L. Only the differences therebetween will be discussed, the like or the same part will not be repeated again, and the like numeral references indicate the like elements.

Figure 4A:
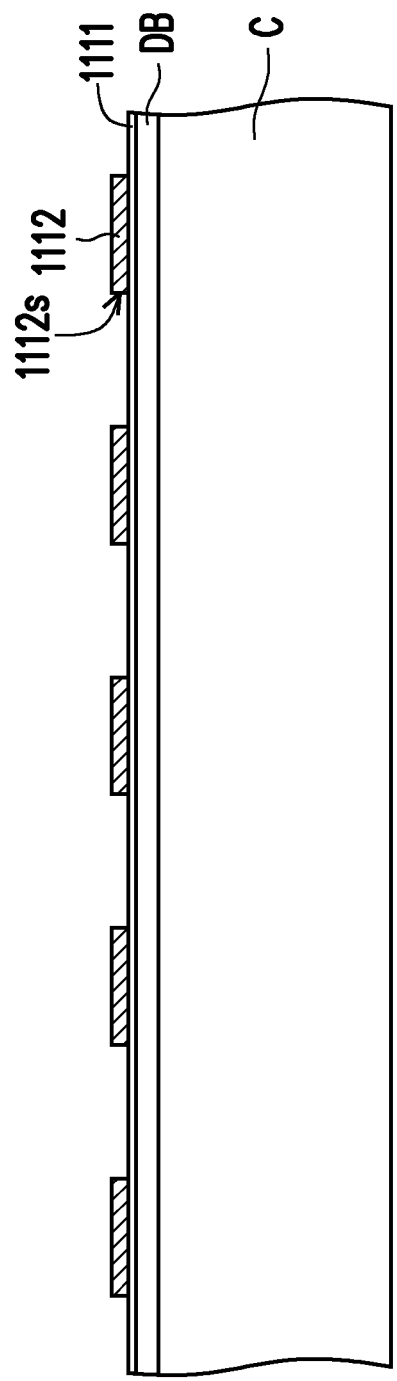
FIGS. 4A-4E are schematic cross-sectional views of various stages of manufacturing a semiconductor package in accordance with some embodiments.

Referring to FIG. 4A, the seed material layer 1111 is formed over the temporary carrier C, and then the conductive material layer 1112 is formed on the seed material layer 1111. For example, the temporary carrier C is provided with the de-bonding layer DB, and the seed material layer 1111 is formed on the de-bonding layer DB. The forming processes of the seed material layer 1111 and the conductive material layer 1112 may be similar to the processes described in FIGS. 1A-1B. In some embodiments, after forming the conductive material layer 1112 in the openings OP1 of the mask layer PR (shown in FIG. 1B), the mask layer PR is removed to expose the seed material layer 1111. The difference between FIGS. 1C and 4A includes that the etching process is not performed on the seed material layer 1111 at this stage. Since the etching process is omitted, the edge of the conductive material layer 1112 may not be etched after removing the mask layer PR. For example, the sidewalls 1112s of the conductive material layer 1112 may substantially vertical after removing the mask layer PR. In some embodiments, the conductive material layer 1112 has a rectangular shape in the cross-sectional view after removing the mask layer PR.

Figure 4B:
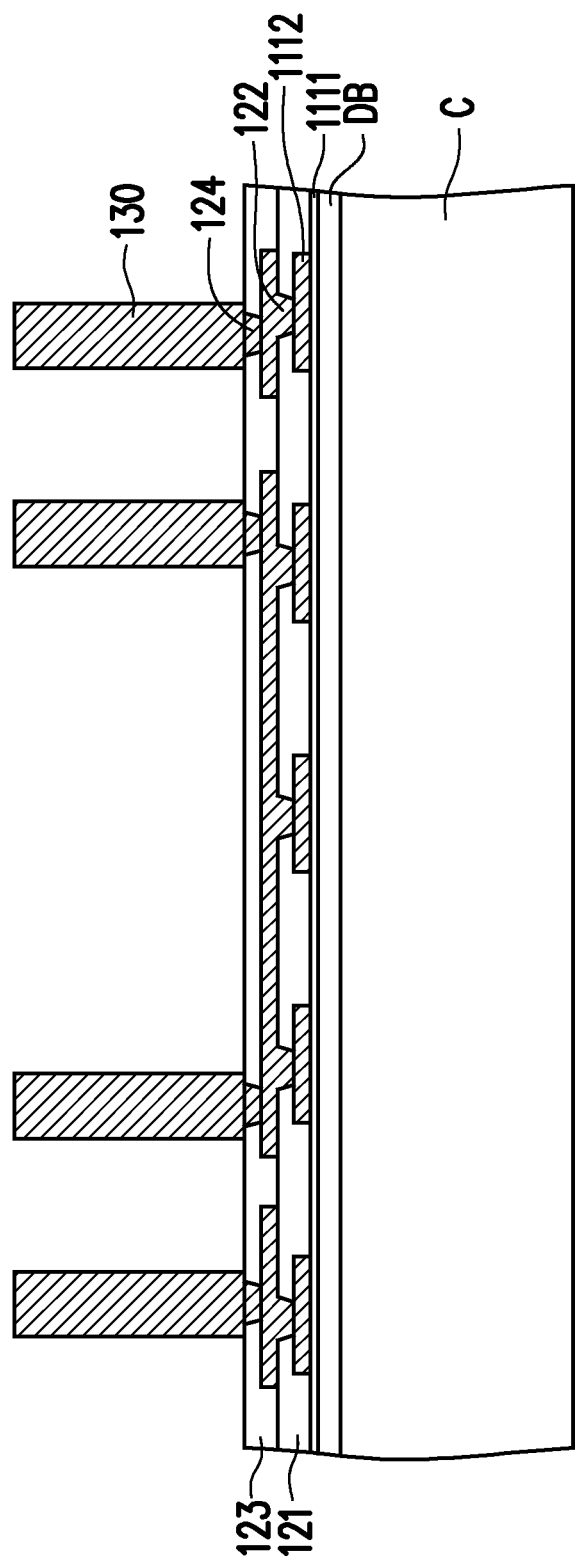

Referring to FIG. 4B, a plurality of first patterned dielectric layers (121 and 123) and a plurality of first patterned conductive layers (122 and 124) are formed over the temporary carrier C. For example, the first patterned dielectric layer 121 is formed on the seed material layer 1111 to partially cover the conductive material layer 1112, and then the first patterned conductive layer 122 may be formed on the first patterned dielectric layer 121 and extend into the first patterned dielectric layer 121 to be in physical and electrical contact with the conductive material layer 1112. Subsequently, the first patterned dielectric layer 123 and the first patterned conductive layer 124 are optionally formed on the first patterned dielectric layer 121. Next, the TIVs 130 may be formed over the first patterned conductive layer 124. The forming processes of the first patterned dielectric layers, the first patterned conductive layers, and the TIVs may be similar to the processes described in FIGS. 1E-1F, so the detailed descriptions are not repeated for simplicity.

Figure 4C:
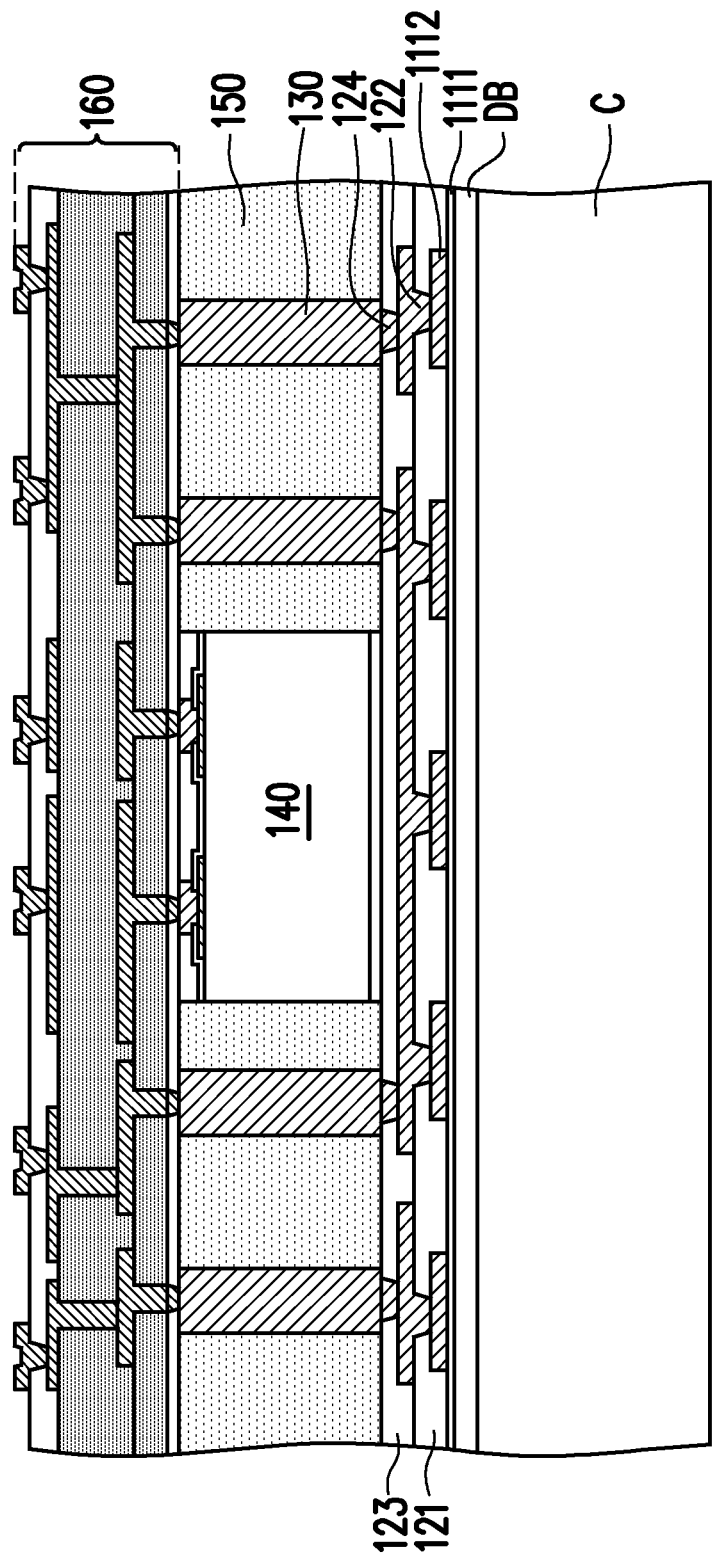

Referring to FIG. 4C, the semiconductor die 140 is placed on the first patterned dielectric layer 123, and then the insulating encapsulation 150 is formed on the first patterned dielectric layer 123 to encapsulate the semiconductor die 140 and the TIVs 130. Subsequently, the second redistribution structure 160 is formed on the insulating encapsulation 150, the TIVs 130, and the semiconductor die 140. The processes may be similar to the processes described in FIGS. 1H-1I, so the detailed descriptions are omitted for the sake of brevity.

Figure 4D:
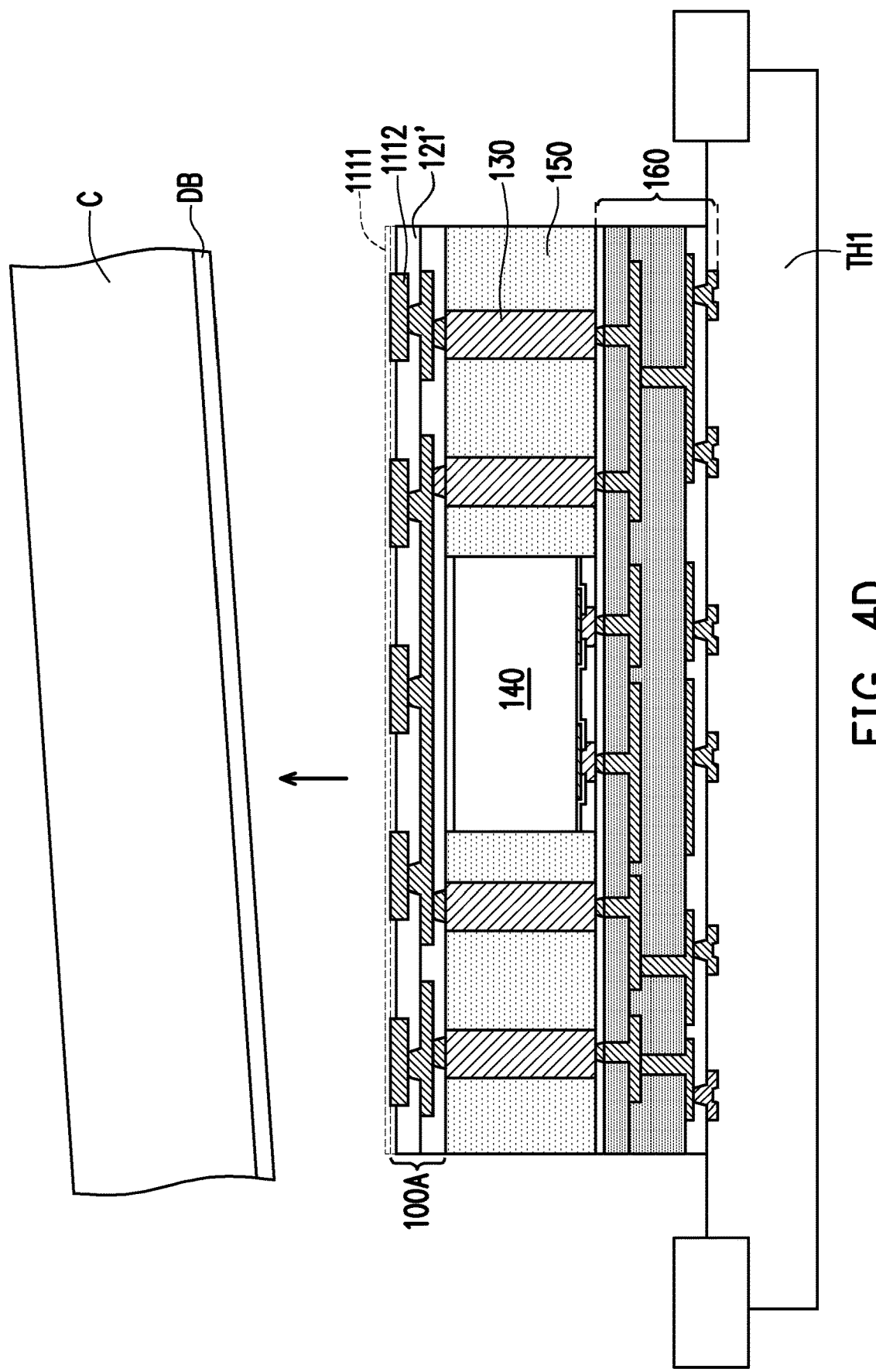

Referring to FIG. 4D, the resulting structure of FIG. 4C may be flipped and placed on the tape holder TH1. The temporary carrier C may be removed to expose the seed material layer 1111. Subsequently, the seed material layer 1111 covering the conductive material layer 1112 is removed to expose the conductive material layer 1112, and the first patterned dielectric layer 121 may be partially removed to form the etched dielectric layer 121'. The conductive material layer 1112 may be viewed as the UBM pattern of the first redistribution structure 100A for ball mounting. In some embodiments, the first patterned dielectric layer 121 is slightly etched to form the etched dielectric layer 121' during the removing process of the seed material layer 1111. The conductive material layer 1112 may be protruded from the etched dielectric layer 121'.

Figure 4E:
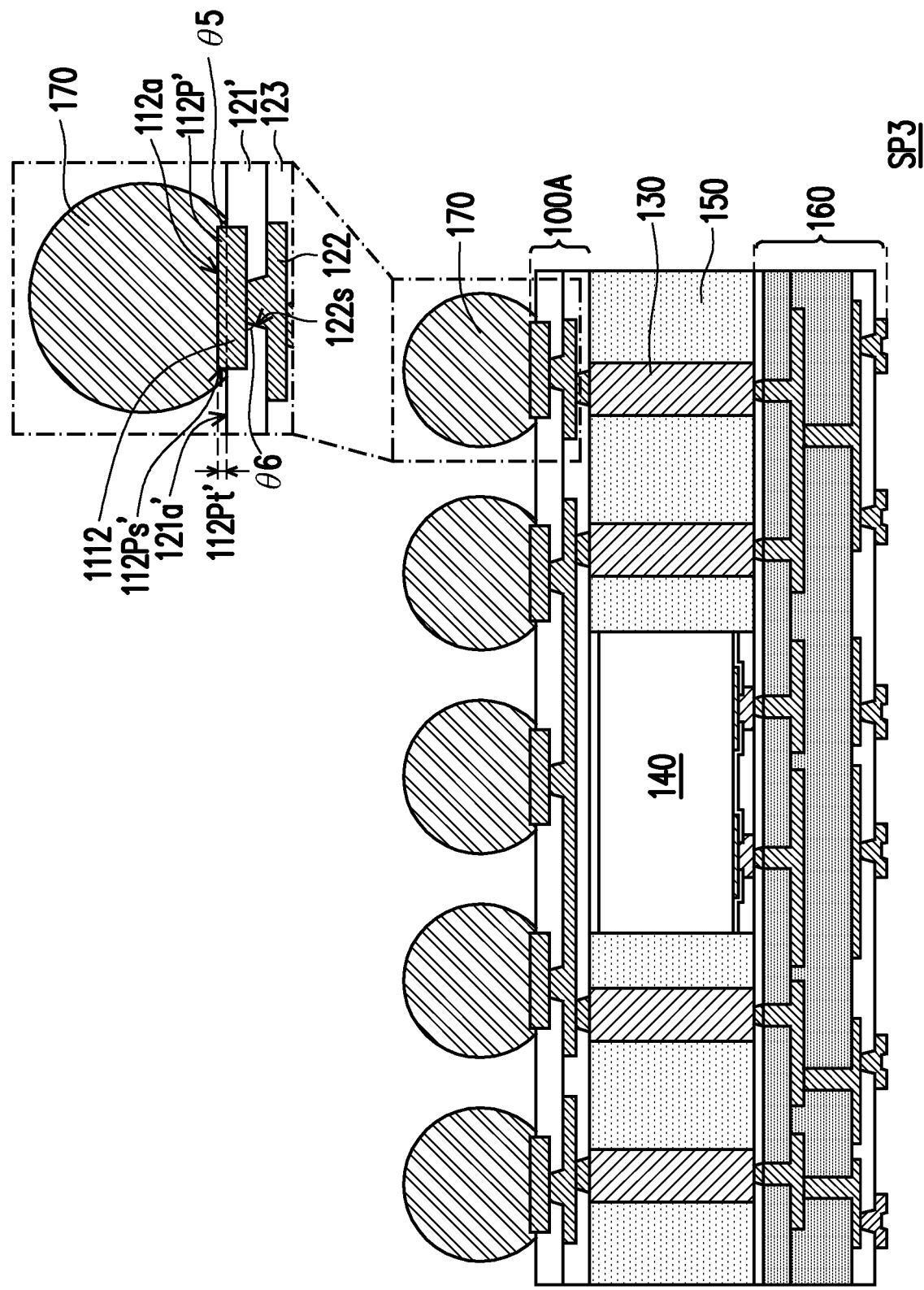

Referring to FIG. 4E, the conductive terminals 170 may be formed on the UBM pattern (i.e. the conductive material layer 1112) of the first redistribution structure 100A. The forming process of the conductive terminals 170 may be similar to the process described in FIGS. 2A-2E, so the detailed descriptions are not repeated for the sake of brevity. In some embodiments, after forming the conductive terminals 170, a singulation process may be performed to separate a plurality of individual package components SP3. In some embodiments, additional package component (e.g., the second package component SP2 shown in FIG. 1M) is bonded to the second redistribution structure 160 before the singulation process so as to form the PoP device.

For example, the difference between the package components SP3 and the first package components SP1 illustrated in FIG. 1M includes that the UBM pattern of the first redistribution structure 100A. In some embodiments, the UBM pattern (i.e. the conductive material layer 1112) of the first redistribution structure 100A has the protruded portion 112P' exposed by the etched dielectric layer 121'. The protruded portion 112P' may be protruded from the bottom surface 121a' of the etched dielectric layer 121'. In some embodiments, a thickness 112Pt' of the protruded portion 112P ranges from about 1 μm to about 3 μm. Although other dimension is possible.

In some embodiments, the protruded portion 112P' is substantially perpendicular to the bottom surface 121a' of the etched dielectric layer 121'. In some embodiments, the angle θ5 between the sidewall 112Ps' of the protruded portion 112P' and the bottom surface 121a' of the etched dielectric layer 121' is about 90°. In some embodiments, the angle θ5 is greater than the angle θ6 between the sidewall 122s of the via portion 122V of the first patterned conductive layer 122 and the top surface 121b' of the etched dielectric layer 121'. In some embodiments, the respective conductive terminal 170 lands on the bottom surface 112a of the protruded portion 112P' of the UBM pattern (i.e. the conductive material layer 1112). In some embodiments, the conductive terminal 170 further extends to cover the sidewall 112Ps' of the protruded portion 112P' and may be in physical contact with the bottom surface 121a' of the etched dielectric layer 121'. In some alternative embodiments, the sidewall 112Ps' of the protruded portion 112P' is not covered by the conductive terminal 170. The manufacturing process described above may be viewed as the UBM pattern first process which may provide benefits by increasing production efficiency and lowering associated costs.

According to some embodiments, a semiconductor package is provided. The semiconductor package includes a semiconductor die laterally covered by an insulating encapsulation, a first redistribution structure disposed on the semiconductor die and the insulating encapsulation, a second redistribution structure disposed on the semiconductor die and the insulating encapsulation and opposite to the first redistribution structure, and a through insulating via penetrating through the insulating encapsulation. The semiconductor die is electrically coupled to the first redistribution structure through the second redistribution structure and the through insulating via. The first redistribution structure includes a patterned conductive layer covered by a patterned dielectric layer, and an UBM pattern partially covered by the patterned dielectric layer. A first portion of the UBM pattern is in physical contact with a via portion of the patterned conductive layer which is tapered toward the UBM pattern, and a second portion of the UBM pattern is connected to the first portion and protruded from the patterned dielectric layer.

According to some alternative embodiments, a semiconductor package is provided. The semiconductor package includes a semiconductor die laterally covered by an insulating encapsulation, a first redistribution structure disposed on the semiconductor die and the insulating encapsulation, a second redistribution structure disposed on the semiconductor die and the insulating encapsulation and opposite to the first redistribution structure, and a through insulating via penetrating through the insulating encapsulation. The semiconductor die is electrically coupled to the first redistribution structure through the second redistribution structure and the through insulating via. The first redistribution structure includes a patterned conductive layer and an under-ball metallurgy (UBM) pattern. The patterned conductive layer includes a via portion which includes an inverted trapezoidal cross section, and the UBM pattern is connected to the via portion of the patterned conductive layer and includes a trapezoidal cross section.

According to some alternative embodiments, a manufacturing method of a semiconductor package includes at least the following steps. A first redistribution is formed, and forming the first redistribution includes forming a patterned dielectric layer to partially cover an under-ball metallurgy (UBM) pattern and forming a patterned conductive layer on the patterned dielectric layer, where a via portion of the patterned conductive layer penetrates through the patterned dielectric layer to be in contact with a first portion of the UBM pattern. An encapsulated die is formed on the first redistribution structure. The patterned dielectric layer is thinned to form a thinned dielectric layer so that a second portion of the UBM pattern connected to the first portion is protruded from the thinned dielectric layer after disposing the encapsulated die. A conductive terminal is formed on the second portion of the UBM pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
  a semiconductor die laterally covered by an insulating encapsulation;
  a first redistribution structure disposed on the semiconductor die and the insulating encapsulation, the first redistribution structure comprising:
    a patterned conductive layer covered by a patterned dielectric layer; and
    an under-ball metallurgy (UBM) pattern, a first portion of the UBM pattern laterally covered by the patterned dielectric layer and being in physical contact with a via portion of the patterned conductive layer which is tapered toward the UBM pattern, and a second portion of the UBM pattern connected to the first portion, wherein a bottommost surface of the second portion is protruded from a bottommost surface of the patterned dielectric layer, and sidewalls of the first portion and the second portion of the UBM pattern are coterminous, tilted, and have a same slope;
  a second redistribution structure disposed on the semiconductor die and the insulating encapsulation and opposite to the first redistribution structure; and
  a through insulating via penetrating through the insulating encapsulation, the semiconductor die electrically coupled to the first redistribution structure through the second redistribution structure and the through insulating via.

2. The semiconductor package of claim 1, wherein both of the first portion and the second portion of the UBM pattern are tapered toward the via portion of the patterned conductive layer.

3. The semiconductor package of claim 2, wherein a first angle is between the sidewall of the first portion of the UBM pattern and the bottommost surface of the patterned dielectric layer, a second angle is between a sidewall of the via portion of the patterned conductive layer and a top surface of the patterned dielectric layer, and the first angle is greater than the second angle.

4. The semiconductor package of claim 1, further comprising:
  a conductive terminal disposed on and electrically connected to the UBM pattern of the first redistribution structure, wherein the sidewall of the first portion of the UBM pattern protruded from the patterned dielectric layer is covered by the conductive terminal.

5. The semiconductor package of claim 4, wherein the conductive terminal comprises at least one void located in proximity to the UBM pattern, and an area occupied by the at least one void is less than 10% of an area of the UBM pattern in a top view.

6. The semiconductor package of claim 1, wherein a third angle is between the sidewall of the second portion and the bottommost surface of the second portion of the UBM pattern, a fourth angle is between a sidewall of the via portion of the patterned conductive layer and a top surface of the via portion of the patterned conductive layer, and the third angle is greater than the fourth angle.

7. The semiconductor package of claim 1, wherein the second redistribution structure comprises a first dielectric layer and a second dielectric layer, the first dielectric layer is interposed between the second dielectric layer and the insulating encapsulation, and the second dielectric layer is more rigid than the first dielectric layer.

8. The semiconductor package of claim 1, wherein the first redistribution structure further comprises additional patterned dielectric layer interposed between the patterned dielectric layer and the insulating encapsulation to partially cover the patterned conductive layer, a thickness of the patterned dielectric layer is less than a thickness of the additional patterned dielectric layer.

9. The semiconductor package of claim 1, further comprising:
  a package component disposed on the second redistribution structure and electrically coupled to the semiconductor die.

10. A semiconductor package, comprising:
  a semiconductor die laterally covered by an insulating encapsulation;
  a first redistribution structure disposed on the semiconductor die and the insulating encapsulation, the first redistribution structure comprising:
    a patterned conductive layer comprising a via portion which comprises an inverted trapezoidal cross section; and
    an under-ball metallurgy (UBM) pattern connected to the via portion of the patterned conductive layer and comprising:
      a top portion comprising a first tilted sidewall connected to a first top surface and a first bottom surface, a shorter base edge of the inverted trapezoidal cross section of the via portion of the patterned conductive layer landing on the first top surface, wherein the first bottom surface is wider than the first top surface; and a bottom portion comprising a second top surface, a second bottom surface, and a second tilted sidewall having a same slope as the first tilted sidewall and connected to the first tilted sidewall and the second bottom surface, wherein the second top surface is the first bottom surface and is narrower than the second bottom surface;

a second redistribution structure disposed on the semiconductor die and the insulating encapsulation and opposite to the first redistribution structure; and a through insulating via penetrating through the insulating encapsulation, the semiconductor die electrically coupled to the first redistribution structure through the second redistribution structure and the through insulating via.

11. The semiconductor package of claim 10, wherein the first redistribution structure further comprises a patterned dielectric layer laterally covering the via portion of the patterned conductive layer and the top portion of the UBM pattern connected to the via portion, and the bottom portion of the UBM pattern connected to the top portion of the UBM pattern is protruded from the patterned dielectric layer.

12. The semiconductor package of claim 11, wherein the first redistribution structure further comprises additional patterned dielectric layer interposed between the patterned dielectric layer and the insulating encapsulation to partially cover the patterned conductive layer, a thickness of the patterned dielectric layer is less than a thickness of the additional patterned dielectric layer.

13. The semiconductor package of claim 10, wherein an acute angle of a trapezoidal cross section of the UBM pattern is greater than an acute angle of the inverted trapezoidal cross section of the via portion of the patterned conductive layer.

14. The semiconductor package of claim 10, further comprising:

a conductive terminal disposed on and electrically connected to the UBM pattern of the first redistribution structure, wherein the conductive terminal partially covers the second tilted sidewall of the UBM pattern.

15. The semiconductor package of claim 10, wherein the second redistribution structure comprises a first dielectric layer and a second dielectric layer, the first dielectric layer is interposed between the second dielectric layer and the insulating encapsulation, and the second dielectric layer is more rigid than the first dielectric layer.

16. A manufacturing method of a semiconductor package, comprising:

forming a first redistribution structure comprising:

forming a patterned dielectric layer to partially cover an under-ball metallurgy (UBM) pattern; and forming a patterned conductive layer on the patterned dielectric layer, wherein a via portion of the patterned conductive layer penetrates through the patterned dielectric layer to be in contact with a first portion of the UBM pattern, wherein the via portion is tapered toward the first portion of the UBM pattern;

forming an encapsulated die on the first redistribution structure;

thinning the patterned dielectric layer to form a thinned dielectric layer so that a second portion of the UBM pattern connected to the first portion comprises a bottommost surface that is protruded from a bottommost surface of the thinned dielectric layer after disposing the encapsulated die, wherein sidewalls of the first portion and the second portion of the UBM pattern are coterminous, tilted, and have a same slope; and forming a conductive terminal on the second portion of the UBM pattern.

17. The manufacturing method of claim 16, wherein forming the first redistribution structure further comprises:

forming a seed material layer on a de-bonding layer over a temporary carrier;

forming a conductive material pattern on the seed material layer; and patterning the seed material layer using the conductive material pattern as a mask to form a conductive pattern comprising a trapezoidal cross section.

18. The manufacturing method of claim 17, wherein thinning the patterned dielectric layer comprises:

removing the temporary carrier and the de-bonding layer to expose the conductive pattern, wherein a portion of the patterned dielectric layer is removed during the removal of the de-bonding layer.

19. The manufacturing method of claim 17, further comprising:

removing a remaining seed material layer of the conductive pattern before forming the conductive terminal.

20. The manufacturing method of claim 16, wherein forming the conductive terminal comprises:

disposing a patterned mask over the thinned dielectric layer, wherein the patterned mask is provided with a seal ring, and the patterned mask leans against the thinned dielectric layer through the seal ring;

forming a conductive paste in an aperture of the patterned mask to be on the second portion of the UBM pattern; and reshaping the conductive paste on the second portion of the UBM pattern.

* * * * *